US010461705B2

(12) United States Patent
Rogers

(10) Patent No.: US 10,461,705 B2
(45) Date of Patent: Oct. 29, 2019

(54) APPARATUS AND METHODS FOR OSCILLATION SUPPRESSION OF CASCODE POWER AMPLIFIERS

(71) Applicant: SKYWORKS SOLUTIONS, INC., Woburn, MA (US)

(72) Inventor: John William Mitchell Rogers, Nepean (CA)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/922,134

(22) Filed: Mar. 15, 2018

(65) Prior Publication Data

US 2018/0294781 A1   Oct. 11, 2018

Related U.S. Application Data

(60) Provisional application No. 62/477,011, filed on Mar. 27, 2017.

(51) Int. Cl.
| H03F 1/22 | (2006.01) |
| H03F 3/21 | (2006.01) |
| H03F 3/24 | (2006.01) |
| H03F 3/193 | (2006.01) |
| H03F 1/02 | (2006.01) |
| H03F 1/32 | (2006.01) |

(52) U.S. Cl.
CPC ............ *H03F 3/211* (2013.01); *H03F 1/0222* (2013.01); *H03F 1/22* (2013.01); *H03F 1/3205* (2013.01); *H03F 3/193* (2013.01); *H03F 3/245* (2013.01); *H03F 2200/294* (2013.01); *H03F 2200/372* (2013.01)

(58) Field of Classification Search
CPC . H03F 1/22; H03F 1/223; H03F 1/226; H03F 3/60; H03F 3/68
USPC ................................ 330/283, 286, 295, 311
See application file for complete search history.

(56) References Cited

U.S. PATENT DOCUMENTS

| 4,241,316 A | 12/1980 | Knapp |
| 6,873,212 B2 | 3/2005 | Rogers |
| 6,930,557 B2* | 8/2005 | Shigematsu ............ H03F 1/223 330/286 |
| 7,474,158 B1* | 1/2009 | Yim ...................... H03F 1/0205 330/310 |

(Continued)

OTHER PUBLICATIONS

Rahn et al., "A Fully Integrated Multiband MIMO WLAN Transceiver RFIC" IEEE Journal of Solid-State Circuits, vol. 40, No. 8, Aug. 2005, in 13 pages.

(Continued)

*Primary Examiner* — Steven J Mottola
(74) *Attorney, Agent, or Firm* — Knobbe Martens Olson & Bear LLP

(57) ABSTRACT

Apparatus and methods for oscillation suppression of cascode power amplifiers are provided herein. In certain implementations, a power amplifier system includes a cascode power amplifier including a plurality of transconductance devices that operate in combination with a plurality of cascode devices to amplify a radio frequency input signal. The power amplifier system further includes a bias circuit that biases the plurality of cascode devices with two or more bias voltages that are decoupled from one another at radio frequency to thereby inhibit the cascode power amplifier from oscillating.

20 Claims, 20 Drawing Sheets

(56) References Cited

U.S. PATENT DOCUMENTS

| | | |
|---|---|---|
| 7,821,349 B2 | 10/2010 | Park et al. |
| 8,102,213 B2 * | 1/2012 | Tasic .................. H03F 1/223 330/283 |
| 9,374,040 B2 | 6/2016 | Matsui |
| 2002/0079971 A1 | 6/2002 | Vathulya |
| 2002/0084855 A1 | 7/2002 | Kwon et al. |
| 2004/0195917 A1 | 10/2004 | Rofougaran et al. |
| 2005/0077963 A1 | 4/2005 | Behzad |
| 2005/0077967 A1 | 4/2005 | Behzad et al. |
| 2005/0077968 A1 | 4/2005 | Behzad |
| 2005/0079836 A1 | 4/2005 | Behzad |
| 2005/0083117 A1 | 4/2005 | Kim et al. |
| 2005/0087887 A1 | 4/2005 | Behzad et al. |
| 2005/0088241 A1 | 4/2005 | Behzad |
| 2005/0088242 A1 | 4/2005 | Behzad |
| 2005/0090209 A1 | 4/2005 | Behzad |
| 2005/0134359 A1 | 6/2005 | Lopez et al. |
| 2006/0028280 A1 | 2/2006 | Behzad |
| 2006/0220748 A1 | 10/2006 | Behzad |
| 2007/0030077 A1 | 2/2007 | Behzad |
| 2007/0032064 A1 | 2/2007 | Behzad |
| 2007/0229165 A1 * | 10/2007 | Elmala ................ H03F 1/0288 330/286 |
| 2007/0296507 A1 | 12/2007 | Hamaguchi |
| 2008/0231368 A1 | 9/2008 | Suzaki et al. |
| 2009/0124219 A1 | 5/2009 | Behzad |
| 2010/0271128 A1 | 10/2010 | Afsahi |
| 2010/0271135 A1 | 10/2010 | Afsahi et al. |
| 2010/0315168 A1 | 12/2010 | Li et al. |
| 2011/0063035 A1 | 3/2011 | Park et al. |
| 2013/0285750 A1 | 10/2013 | Chowdhury et al. |
| 2014/0266461 A1 | 9/2014 | Youssef et al. |
| 2014/0269979 A1 | 9/2014 | Schafferer et al. |
| 2015/0028829 A1 | 1/2015 | Chowdhury et al. |
| 2015/0146819 A1 | 5/2015 | Chowdhury et al. |
| 2015/0171878 A1 | 6/2015 | Schafferer et al. |
| 2015/0326188 A1 | 11/2015 | Komiak et al. |
| 2016/0191001 A1 | 6/2016 | Ripley et al. |
| 2016/0191002 A1 | 6/2016 | Ripley et al. |
| 2016/0191086 A1 | 6/2016 | Ripley et al. |
| 2017/0026005 A1 | 1/2017 | Ripley et al. |
| 2017/0133988 A1 | 5/2017 | Rogers |
| 2017/0149390 A1 | 5/2017 | Rogers et al. |
| 2017/0302231 A1 | 10/2017 | Ripley et al. |
| 2018/0062580 A1 | 3/2018 | Rogers |

OTHER PUBLICATIONS

Rogers et al., "The Effect of Varactor Nonlinearity on the Phase Noise of Completely Integrated VCOs" IEEE Journal of Solid-State Circuits, vol. 35, No. 9, Sep. 2000, in 8 pages.

* cited by examiner

APPARATUS AND METHODS FOR OSCILLATION SUPPRESSION OF CASCODE POWER AMPLIFIERS

CROSS-REFERENCE TO RELATED APPLICATIONS

This application claims the benefit of priority under 35 U.S.C. § 119(e) of U.S. Provisional Patent Application No. 62/477,011, filed Mar. 27, 2017 and titled "APPARATUS AND METHODS FOR OSCILLATION SUPPRESSION OF CASCODE POWER AMPLIFIERS," which is herein incorporated by reference in its entirety.

BACKGROUND

Field

Embodiments of the invention relate to electronic systems, and in particular, to radio frequency (RF) electronics.

Description of the Related Technology

Power amplifiers can be used to boost or amplify a radio frequency (RF) signal. Thereafter, the boosted RF signal can be used for a variety of purposes, including, for example, driving an antenna of an RF communication system.

Power amplifiers can be included in a wide variety of communication devices, including, but not limited to, mobile phones, tablets, base stations, network access points, laptops, computers, and televisions. Power amplifiers provide amplification to RF signals, which can have a frequency in the range from about 450 MHz to about 90 GHz for certain communication standards.

SUMMARY

In certain embodiments, the present disclosure relates to a power amplifier system. The power amplifier system includes an input terminal configured to receive a radio frequency input signal, an output terminal, and a cascode power amplifier including a plurality of transconductance devices each electrically coupled to the input terminal, and a plurality of cascode devices each electrically coupled to the output terminal. The plurality of transconductance devices are configured to operate in combination with the plurality of cascode devices to amplify the radio frequency input signal. The power amplifier system further includes a bias circuit configured to bias the plurality of cascode devices with two or more bias signals that are decoupled from one another at radio frequency so as to provide oscillation suppression to the cascode power amplifier.

In some embodiments, the two or more bias signals include a plurality of bias voltages operable to separately bias the plurality of cascode devices. According several embodiments, the power amplifier system further includes two or more biasing conductors configured to separately route the two or more bias signals to the plurality of cascode devices. In accordance with a number of embodiments, each of the two or more biasing conductors are physically and electrically disconnected from one another.

In various embodiments, the two or more bias signals includes a first bias voltage configured to bias a first portion of the plurality of cascode devices and a second bias voltage configured to bias a second portion of the plurality of cascode devices. In accordance with a number of embodiments, the two or more bias signals further includes a third bias voltage configured to bias a third portion of the plurality of cascode devices. According to several embodiments, the power amplifier system further includes a radio frequency isolation circuit electrically coupled between the first bias voltage and the second bias voltage.

In some embodiments, the plurality of transconductance devices include a plurality of common emitter bipolar transistors.

In a number of embodiments, the plurality of transconductance devices include a plurality of common source field-effect transistors.

In several embodiments, the plurality of cascode devices include a plurality of common gate field-effect transistors.

In various embodiments, the plurality of cascode devices include a plurality of common base bipolar transistors.

In some embodiments, the bias circuit includes a plurality of source follower field-effect transistors configured to bias the plurality of cascode devices with a plurality of bias voltages that are decoupled from one another at radio frequency.

In several embodiments, the bias circuit includes a plurality of emitter follower bipolar transistors configured to bias the plurality of cascode devices with a plurality of bias voltages that are decoupled from one another at radio frequency.

In various embodiments, the power amplifier system further includes a choke inductor electrically connected between a supply voltage and the output terminal, the choke inductor configured to provide the supply voltage to the plurality of cascode devices.

In some embodiments, the bias circuit is further configured to bias the plurality of transconductance devices with a common bias signal.

In several embodiments, the power amplifier system further includes a plurality of degeneration circuits electrically coupled between the plurality of transconductance devices and ground. In accordance with a number of embodiments, the plurality of degeneration circuits include a plurality of degeneration resistors.

In various embodiments, the bias circuit includes a plurality of AC grounding capacitors electrically connected between the plurality of cascode devices and ground.

In certain embodiments, the present disclosure relates to a packaged module. The packaged module includes a package substrate, and a semiconductor die attached to the package substrate. The semiconductor die includes an input terminal configured to receive a radio frequency input signal, an output terminal, and a cascode power amplifier including a bias circuit, a plurality of transconductance devices each electrically coupled to the input terminal, and a plurality of cascode devices each electrically coupled to the output terminal. The plurality of transconductance devices are configured to operate in combination with the plurality of cascode devices to amplify the radio frequency input signal. Additionally, the bias circuit is configured to bias the plurality of cascode devices with two or more bias signals that are decoupled from one another at radio frequency so as to provide oscillation suppression to the cascode power amplifier.

In some embodiments, the two or more bias signals include a plurality of bias voltages operable to separately bias the plurality of cascode devices. In accordance with a number of embodiments, the semiconductor die further includes two or more biasing conductors configured to separately route the two or more bias signals to the plurality of cascode devices. According to several embodiments, each of the two or more biasing conductors are physically and electrically disconnected from one another.

In various embodiments, the two or more bias signals includes a first bias voltage configured to bias a first portion of the plurality of cascode devices and a second bias voltage configured to bias a second portion of the plurality of cascode devices. According to a number of embodiments, the two or more bias signals further includes a third bias voltage configured to bias a third portion of the plurality of cascode devices. In accordance with several embodiments, the cascode power amplifier further includes a radio frequency isolation circuit electrically coupled between the first bias voltage and the second bias voltage.

In some embodiments, the plurality of transconductance devices include a plurality of common emitter bipolar transistors.

In a number of embodiments, the plurality of transconductance devices include a plurality of common source field-effect transistors.

In several embodiments, the plurality of cascode devices include a plurality of common gate field-effect transistors.

In various embodiments, the plurality of cascode devices include a plurality of common base bipolar transistors.

In some embodiments, the bias circuit includes a plurality of source follower field-effect transistors configured to bias the plurality of cascode devices with a plurality of bias voltages that are decoupled from one another at radio frequency.

In several embodiments, the bias circuit includes a plurality of emitter follower bipolar transistors configured to bias the plurality of cascode devices with a plurality of bias voltages that are decoupled from one another at radio frequency.

In various embodiments, the semiconductor die further includes a choke inductor electrically connected between a supply voltage and the output terminal, the choke inductor configured to provide the supply voltage to the plurality of cascode devices.

In a number of embodiments, the bias circuit is further configured to bias the plurality of transconductance devices with a common bias signal.

In some embodiments, the cascode power amplifier further includes a plurality of degeneration circuits electrically coupled between the plurality of transconductance devices and ground. In accordance with several embodiments, the plurality of degeneration circuits include a plurality of degeneration resistors.

In a number of embodiments, the bias circuit includes a plurality of AC grounding capacitors electrically connected between the plurality of cascode devices and ground.

In certain embodiments, the present disclosure relates to a wireless communication device. The wireless communication device includes a transmitter configured to generate a radio frequency signal. The wireless communication device further includes a cascode power amplifier system including an input terminal configured to receive the radio frequency signal, an output terminal, a bias circuit, a plurality of transconductance devices each electrically coupled to the input terminal, and a plurality of cascode devices each electrically coupled to the output terminal. The plurality of transconductance devices are configured to operate in combination with the plurality of cascode devices to amplify the radio frequency signal to thereby generate an amplified radio frequency signal. Additionally, the bias circuit is configured to bias the plurality of cascode devices with two or more bias signals that are decoupled from one another at radio frequency so as to provide oscillation suppression. The wireless communication device further includes an antenna configured to receive the amplified radio frequency signal.

In some embodiments, the wireless communication device further includes a switch, and the antenna is electrically connected to the output terminal of the cascode power amplifier system via the switch.

In various embodiments, the two or more bias signals include a plurality of bias voltages operable to separately bias the plurality of cascode devices. In accordance with several embodiments, the cascode power amplifier system further includes two or more biasing conductors configured to separately route the two or more bias signals to the plurality of cascode devices. According to a number of embodiments, each of the two or more biasing conductors are physically and electrically disconnected from one another.

In various embodiments, the two or more bias signals includes a first bias voltage configured to bias a first portion of the plurality of cascode devices and a second bias voltage configured to bias a second portion of the plurality of cascode devices. According to a number of embodiments, the two or more bias signals further includes a third bias voltage configured to bias a third portion of the plurality of cascode devices. In accordance with several embodiments, the cascode power amplifier system further includes a radio frequency isolation circuit electrically coupled between the first bias voltage and the second bias voltage.

In some embodiments, the plurality of transconductance devices include a plurality of common emitter bipolar transistors.

In various embodiments, the plurality of transconductance devices include a plurality of common source field-effect transistors.

In a number of embodiments, the plurality of cascode devices include a plurality of common gate field-effect transistors.

In several embodiments, the plurality of cascode devices include a plurality of common base bipolar transistors.

In some embodiments, the bias circuit includes a plurality of source follower field-effect transistors configured to bias the plurality of cascode devices with a plurality of bias voltages that are decoupled from one another at radio frequency.

In a number of embodiments, the bias circuit includes a plurality of emitter follower bipolar transistors configured to bias the plurality of cascode devices with a plurality of bias voltages that are decoupled from one another at radio frequency.

In various embodiments, the cascode power amplifier system further includes a choke inductor electrically connected between a supply voltage and the output terminal, and the choke inductor configured to provide the supply voltage to the plurality of cascode devices.

In several embodiments, the bias circuit is further configured to bias the plurality of transconductance devices with a common bias signal.

In some embodiments, the cascode power amplifier further includes a plurality of degeneration circuits electrically coupled between the plurality of transconductance devices and ground. According to a number of embodiments, the plurality of degeneration circuits include a plurality of degeneration resistors.

In various embodiments, the bias circuit includes a plurality of AC grounding capacitors electrically connected between the plurality of cascode devices and ground.

DETAILED DESCRIPTION OF EMBODIMENTS

Figure 1:
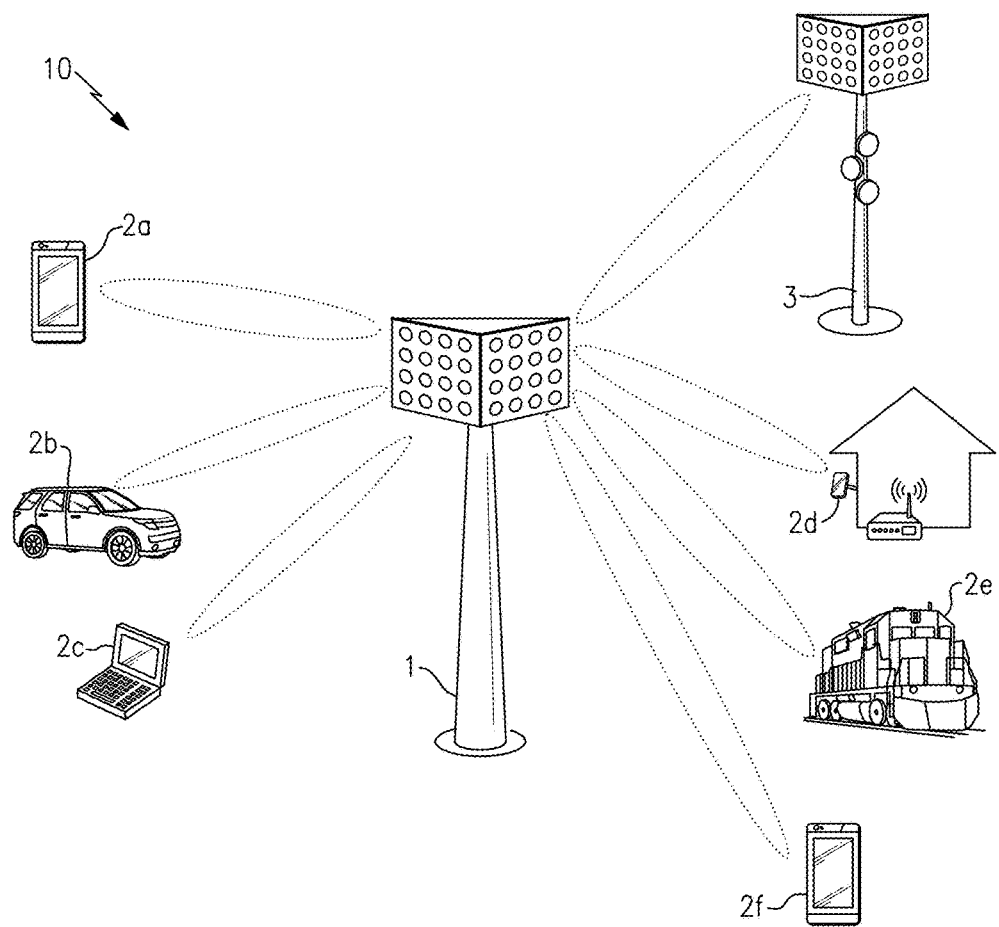
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-TOT), Vehicle-to-Everything (V2X), and High Power User Equipment (HPUE).

3GPP plans to introduce Phase 1 of fifth generation (5G) technology in Release 15 (targeted for 2018) and Phase 2 of 5G technology in Release 16 (targeted for 2019). Release 15 is anticipated to address 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
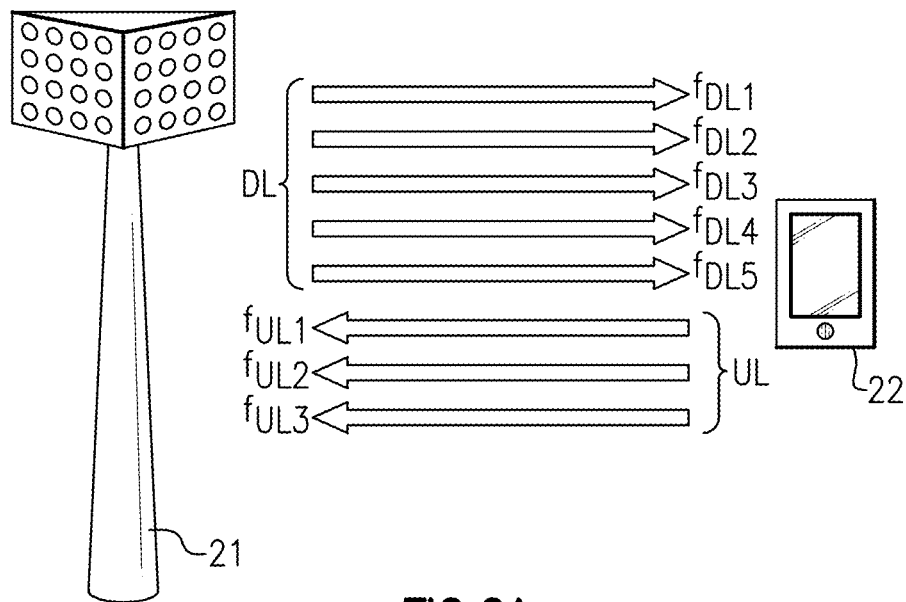
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
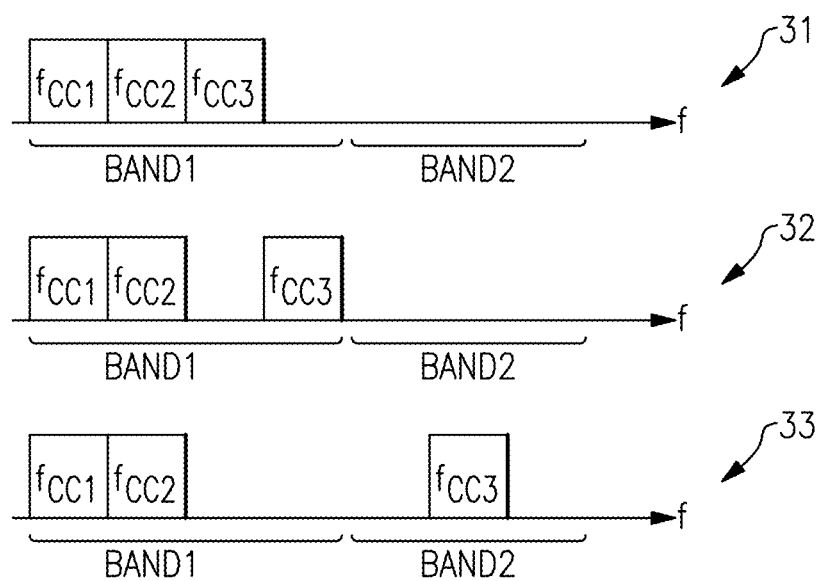
FIG. 2B illustrates various examples of carrier aggregation for the communication link of FIG. 2A.

FIG. 2B illustrates various examples of carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{cc1}$, a second component carrier $f_{cc2}$, and a third component carrier $f_{cc3}$. Although FIG. 2B is illustrated in the context of aggregating three component carriers, carrier aggregation can be used to aggregate more or fewer carriers.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{cc1}$, $f_{cc2}$, and $f_{cc3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{cc1}$, $f_{cc2}$, and $f_{cc3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{cc1}$ and $f_{cc2}$ of a first frequency band BAND1 with component carrier $f_{cc3}$ of a second frequency band BAND2.

With reference to FIGS. 2A and 2B, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

Figure 3A:
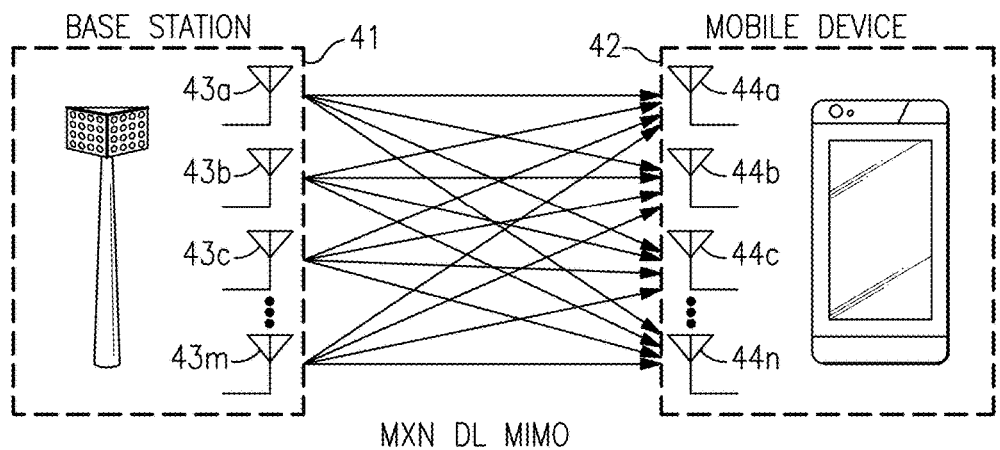
FIG. 3A is a schematic diagram of one example of a downlink channel using multi-input and multi-output (MIMO) communications.
Figure 3B:
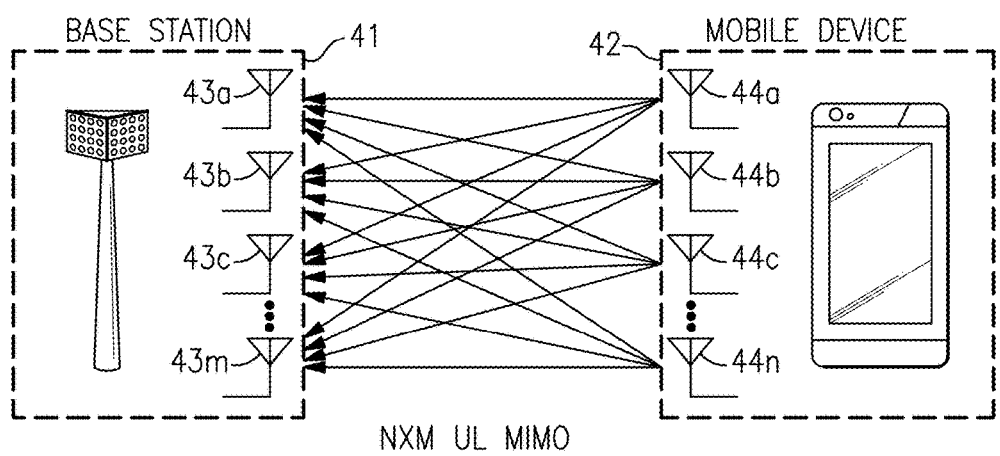
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of N×M UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 4A:
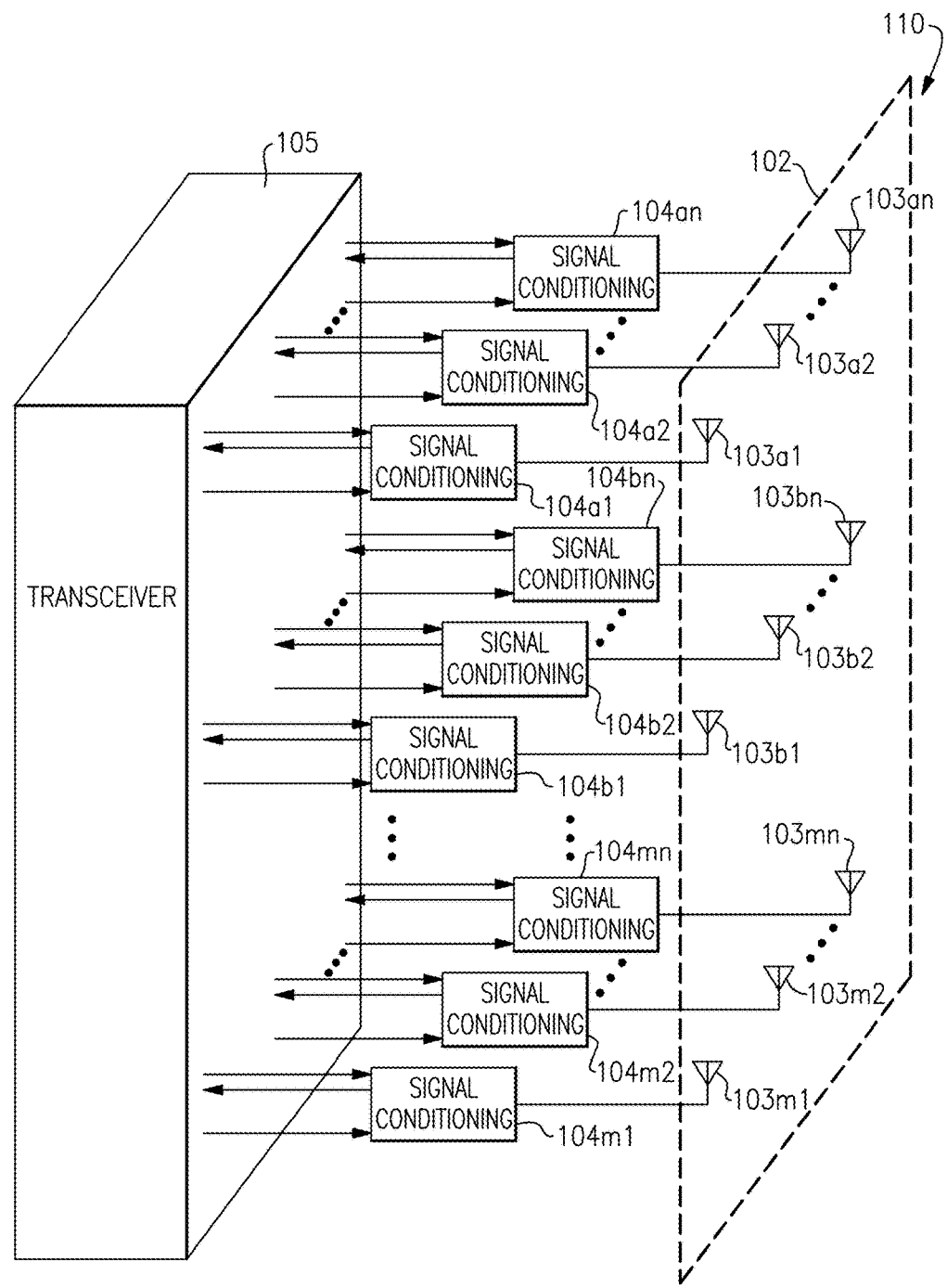
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the phase of transmitted or received signals to control beam forming.

Figure 4B:
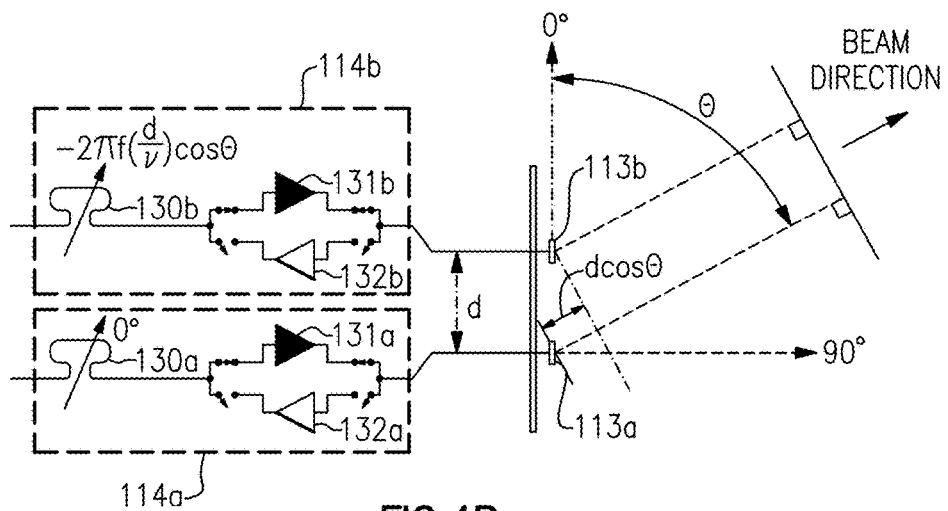
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a transceiver (for example, the transceiver 105 of FIG. 4A) controls phase values of one or more phase shifters to control beamforming.

Figure 4C:
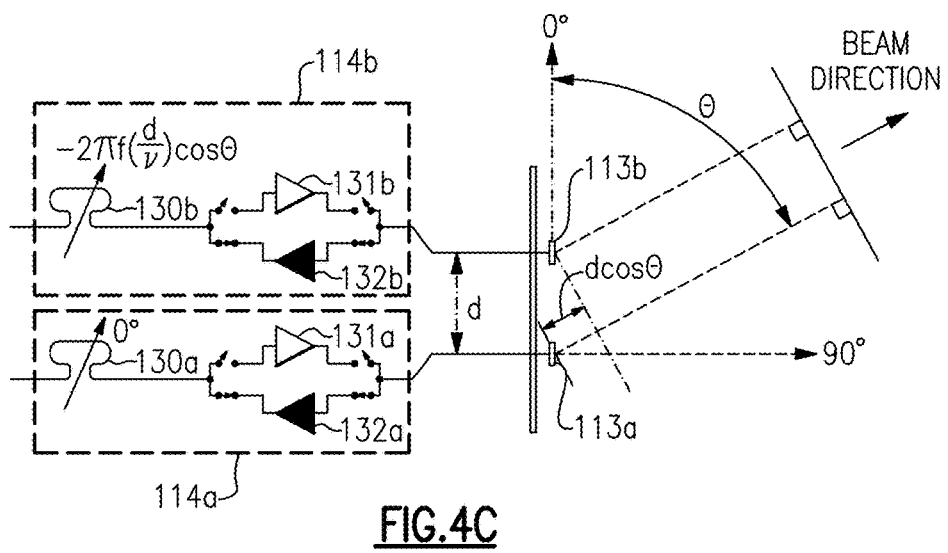
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½λ, the phase difference can be selected to about equal to $-\pi \cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Cascode Power Amplifiers with Separated Cascode Biasing for Oscillation Suppression A cascode power amplifier includes a transconductance device, such as a common emitter transistor or a common source transistor, connected in series with a cascode device, such as a common base transistor or a common gate transistor. A cascode power amplifier can exhibit high gain, wide bandwidth, superior impedance characteristics, and/or a number of other desirable performance parameters.

To achieve a certain output power handling capability, a cascode power amplifier can be implemented using multiple transistor cells that are electrically connected in parallel with one another. By parallelizing transistor cells, the cascode power amplifier's power handling capability can be scaled to achieve a desired power performance.

The inventor has recognized that oscillation can arise in a cascode power amplifier when a common or shared bias is used to bias the cascode devices of multiple transistor cells of the cascode power amplifier. In particular, a cascode power amplifier using a common bias for each cascode device can behave at high frequencies as a differential Colpitts oscillator.

For example, a shared bias voltage can be routed using a metal conductor to the gate or base of each cascode device, and an AC grounding capacitor can be provided for each cascode device between the gate or base and ground. Although the AC grounding capacitors theoretically provide AC ground to the cascode devices, the inventor has recognized that a parasitic inductance is present between each AC grounding capacitor and ground. Additionally, the parasitic inductance and AC grounding capacitor resonate at a resonant frequency, above which the series combination of the AC grounding capacitor and parasitic inductance behaves inductively. The metal conductor used for biasing also exhibits parasitic inductance, and thus at high frequencies inductance is present between the cascode devices. The combination of the parasitic inductances and transistor junction capacitances result in the cascode power amplifier behaving as a differential Colpitts oscillator at high frequencies.

Although a relatively short biasing conductor having low inductance can be used to distribute a shared bias signal to the cascode devices, the cascode power amplifier's layout can be constrained by a limitation on the biasing conductor's length. Moreover, when providing amplification to RF signals of relatively high frequency, for instance, 5 GHz or more, a cascode power amplifier can be susceptible to oscillation in the presence of even relatively small parasitic inductances and short conductor lengths.

Apparatus and methods for oscillation suppression of cascode power amplifiers are provided herein. In certain implementations, a power amplifier system includes a cascode power amplifier including a plurality of transconductance devices that operate in combination with a plurality of cascode devices to amplify a radio frequency input signal. The power amplifier system further includes a bias circuit that biases the plurality of cascode devices with two or more bias voltages that are decoupled from one another at radio frequency.

By implementing the cascode power amplifier in this manner, the cascode power amplifier exhibits enhanced robustness against oscillation. Furthermore, the cascode power amplifier can be implemented with relaxed layout constraints, such as distance between the transistor cells, without inadvertently oscillating.

The cascode power amplifiers herein can be used to amplify a wide range of frequencies, including relatively high radio frequencies of 5 GHz or more, for instance, millimeter wave frequencies in the range of about 30 GHz to about 300 GHz. In certain implementations, the two or more bias voltages used for biasing are substantially decoupled from one another at frequencies greater than 450 megahertz (MHz).

The cascode power amplifier biasing schemes disclosed herein are applicable to a wide variety of RF communication systems, including, but not limited to, smartphones, base stations, laptops, handsets, wearable electronics, and/or tablets.

Figure 5:
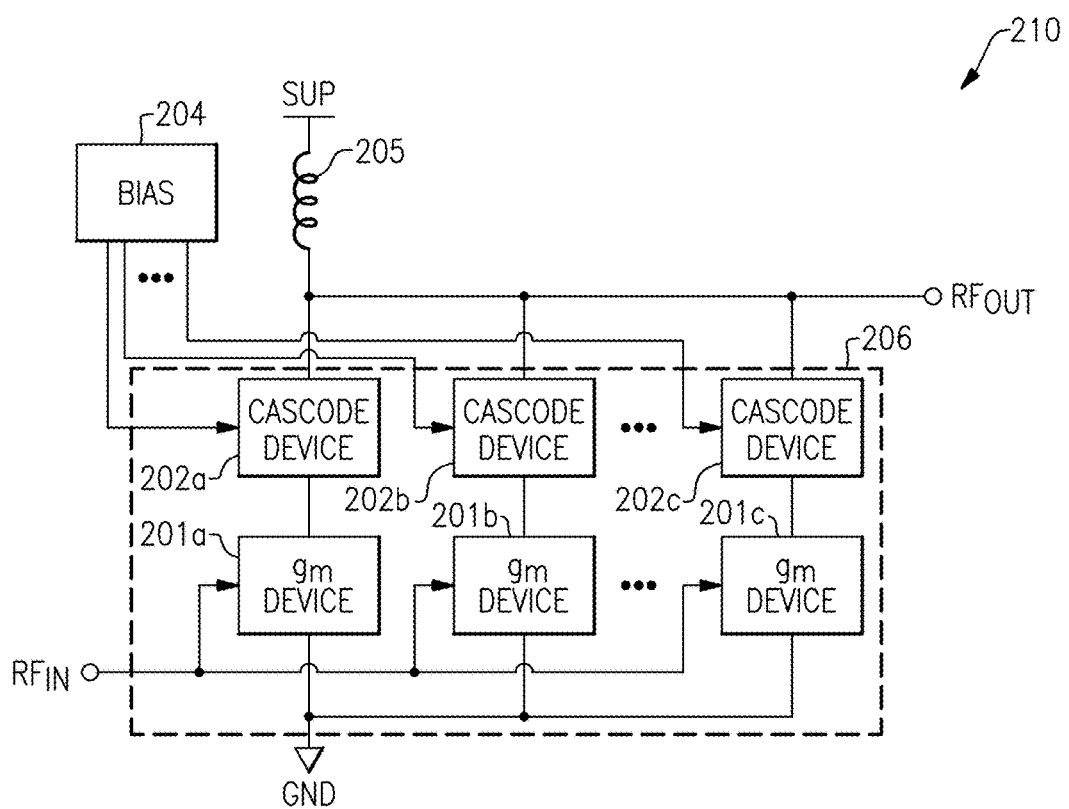
FIG. 5 is a schematic diagram of one embodiment of a power amplifier system with separated cascode biasing.

FIG. 5 is a schematic diagram of one embodiment of a power amplifier system 210 with separated cascode biasing. The power amplifier system 210 includes an input terminal RF$_{IN}$, an output terminal RF$_{OUT}$, a bias circuit 204, a choke inductor 205, and a cascode power amplifier 206 that includes transconductance (g$_m$) devices 201a-201c and cascode devices 202a-202c.

In the illustrated embodiment, the cascode power amplifier 206 includes multiple transistor cells that are electrically connected in parallel with one another. Additionally, each transistor cell includes a transconductance device and cascode device that is electrically connected in series with one another. For example, the cascode power amplifier 206 includes a first transistor cell associated with the first transconductance device 201a and the first cascode device 202a, a second transistor cell associated with the second transconductance device 201b and the second cascode device 202b, and a third transistor cell associated with the third transconductance device 201c and the third cascode device 202c.

By parallelizing transistor cells, the cascode power amplifier's power handling capability can be increased to achieve a desired output power handling capability. Although an implementation with three transistor cells is shown in FIG. 5, a cascode power amplifier can include more or fewer transistor cells connected in parallel, as indicated by the ellipses. In one implementation, the cascode power amplifier 206 includes at least four transistor cells. In another implementation, the cascode power amplifier 206 includes at least eight transistor cells.

During operation of the power amplifier system 210, the input terminal RF$_{IN}$ receives an RF input signal, and the output terminal RF$_{OUT}$ provides an RF output signal. Additionally, the transconductance devices 201a-201c operate in combination with the cascode devices 202a-202c to amplify the RF input signal to generate the RF output signal.

The illustrated power amplifier system 210 further includes the choke inductor 205, which is electrically connected between the supply voltage SUP and the output terminal RF$_{OUT}$. The choke inductor 205 serves to provide the supply voltage SUP to the cascode devices 202a-202c, while choking or blocking the RF output signal.

As shown in FIG. 5, the bias circuit 204 biases the cascode devices 202a-202c with bias signals that are decoupled from one another at radio frequency to provide oscillation suppression to the power amplifier system 210. In the illustrated embodiment, each of the cascode devices 202a-202c receives a separate bias signal. Thus, the bias signals are disconnected from one another, in this embodiment.

The inventor has recognized that oscillation can arise in a cascode power amplifier when a common or shared bias is used to bias the cascode devices of multiple transistor cells of a cascode power amplifier. In particular, a cascode power amplifier including multiple transistor cells biased using a common bias can behave at high frequencies as a differential Colpitts oscillator. Although a relatively short biasing conductor can be used to provide the bias voltage to the cascode devices, such a short biasing conductor can constrain the cascode power amplifier's layout. Oscillation of cascode power amplifiers using a shared bias can be particular exacerbated in high frequency applications, for instance, 5 GHz or more, in which such a cascode power amplifier can be susceptible to oscillation in the presence of even relatively small parasitic inductances and short wire lengths.

In contrast, the illustrated power amplifier system 210 is implemented with the bias circuit 204, which biases the cascode devices 202a-202c with separate bias signals. Accordingly, the power amplifier system 210 can exhibit robustness against unintended oscillations. Furthermore, the cascode power amplifier 206 can be implemented with relaxed layout constraints, such as distance between the transistor cells, without inadvertently oscillating.

Figure 6:
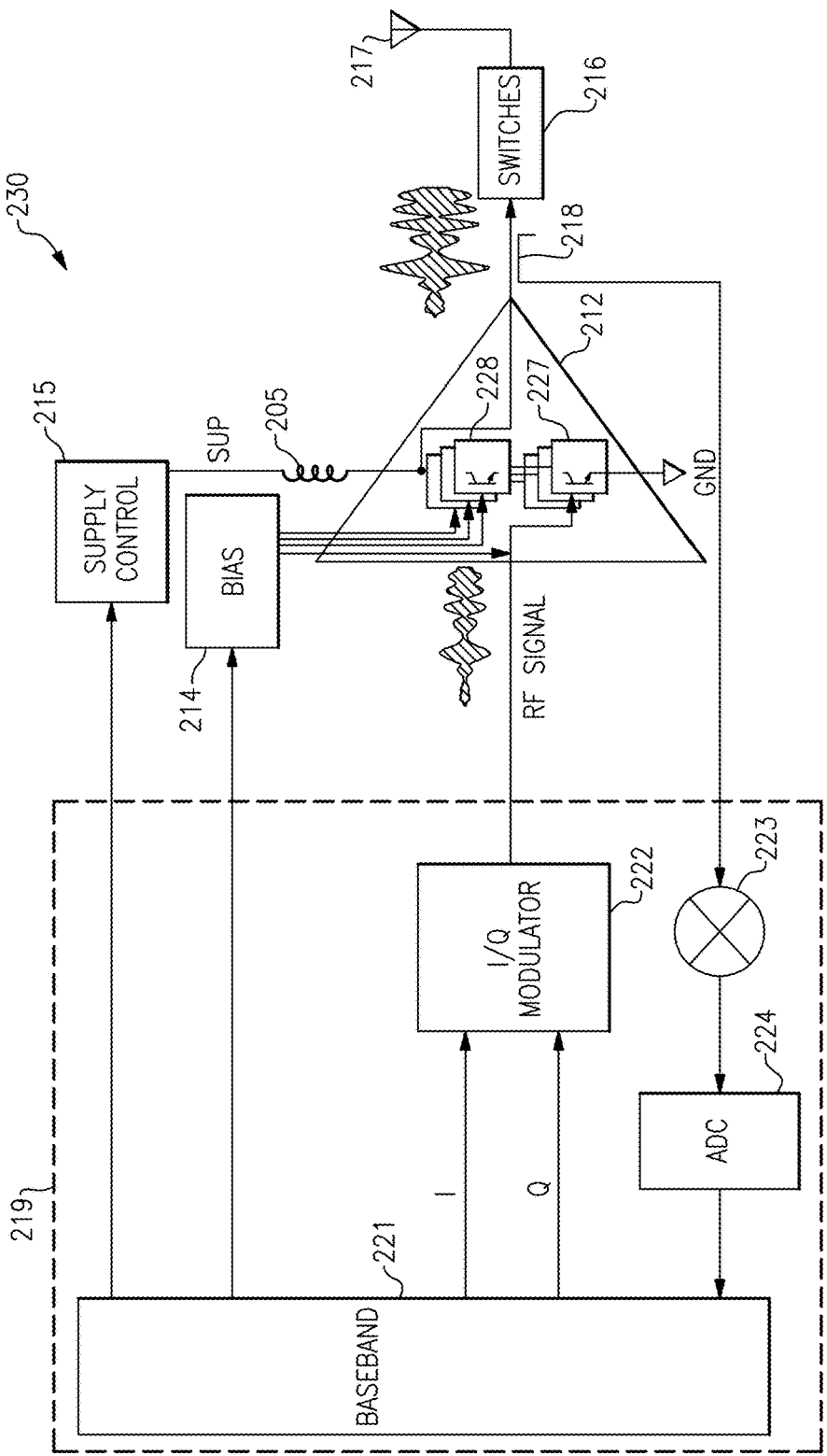
FIG. 6 is a schematic diagram of one embodiment of a radio frequency communication system.

FIG. 6 is a schematic diagram of one embodiment of an RF communication system 230. The illustrated RF communication system 230 includes a choke inductor 205, a cascode power amplifier 212, a bias circuit 214, a supply control circuit 215, switches 216, an antenna 217, a directional coupler 218, and a transmitter 219. The transmitter 219 can be included in a transceiver that also includes circuitry associated with receiving signals from an antenna (for instance, via the antenna 217 or a separate antenna) over one or more receive paths.

The cascode power amplifier 212 includes transconductance devices 227 (implemented as common emitter bipolar transistors, in this embodiment) and cascode devices 228 (implemented as common base bipolar transistors, in this embodiment). Although the RF communication system 230 of FIG. 6 illustrates one example of an RF communication system that can include a cascode power amplifier, the teachings herein are applicable to RF communication systems implemented in a wide variety of ways.

Although the illustrated cascode power amplifier 212 is illustrated as a single stage, the teachings herein are also applicable to multi-stage configurations including two or more stages. In certain implementations, a cascode output stage of a multi-stage power amplifier includes the transconductance devices 227 and the cascode devices 228. In certain embodiments, two or more cascode devices are included in series with each transconductance device. Thus, a cascode amplifier can be implemented with transistor cells including a stack of three or more transistors. In such implementations, all or part of the cascode devices (for instance, upper cascode transistors and/or lower cascode transistors) can include separated cascode biasing.

In the illustrated embodiment, the cascode power amplifier 212 amplifies an RF input signal received from the I/Q modulator 222 of the transmitter 219. The amplified RF signal generated by the cascode power amplifier 212 can be provided to the antenna 217 by way of the switches 216.

As shown in FIG. 6, the cascode power amplifier 212 receives a supply voltage SUP from the supply control circuit 215.

In certain implementations, the supply control circuit 215 dynamically changes the voltage level of the supply voltage SUP over time, for instance, using one or more DC-to-DC converters and/or error amplifiers. For example, the supply control circuit 215 can be implemented to provide average power tracking (APT), envelope tracking (ET), and/or any other suitable supply control scheme. In other implementations, the supply voltage SUP is substantially fixed.

The bias signals received by the cascode power amplifier 212 from the bias circuit 214 bias the cascode power amplifier 212. As shown in FIG. 6, the bias circuit 214 provides the cascode devices 228 with separate bias signals to enhance the robustness of the cascode power amplifier 212 against oscillations.

In the illustrated embodiment, the bias circuit 214 also provides the transconductance devices 227 with a common bias signal. However, other configurations are possible, for instance, implementations in which the transconductance devices are separately biased.

In the illustrated RF communication system 230, the directional coupler 218 is positioned between the output of the cascode power amplifier 212 and the input of the switches 216, thereby allowing a measurement of output power of the cascode power amplifier 212 that does not include insertion loss of the switches 216. The sensed output signal from the directional coupler 218 can be provided to the mixer 223, which can multiply the sensed output signal by a reference signal of a controlled frequency so as to downshift the frequency content of the sensed output signal to generate a downshifted signal. The downshifted signal can be provided to the ADC 224, which can convert the downshifted signal to a digital format suitable for processing by the baseband processor 221.

By including a feedback path between the output of the cascode power amplifier 212 and the baseband processor 221, the baseband processor 221 can be configured to dynamically adjust the I and Q signals to optimize the operation of the RF communication system 230. For example, configuring the RF communication system 230 in this manner can aid in controlling the power added efficiency (PAE) and/or linearity of the cascode power amplifier 212.

The baseband signal processor 221 can generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 222 in a digital format. The baseband processor 221 can be any suitable processor configured to process a baseband signal. For instance, the baseband processor 221 can include a digital signal processor, a microprocessor, a programmable core, or any combination thereof. Moreover, in some implementations, two or more baseband processors 221 can be included in the RF communication system 230.

The I/Q modulator 222 can receive the I and Q signals from the baseband processor 221 and to process the I and Q signals to generate an RF signal. For example, the I/Q modulator 222 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the cascode power amplifier 212. In certain implementations, the I/Q modulator 222 can include one or more filters configured to filter frequency content of signals processed therein.

Figure 7A:
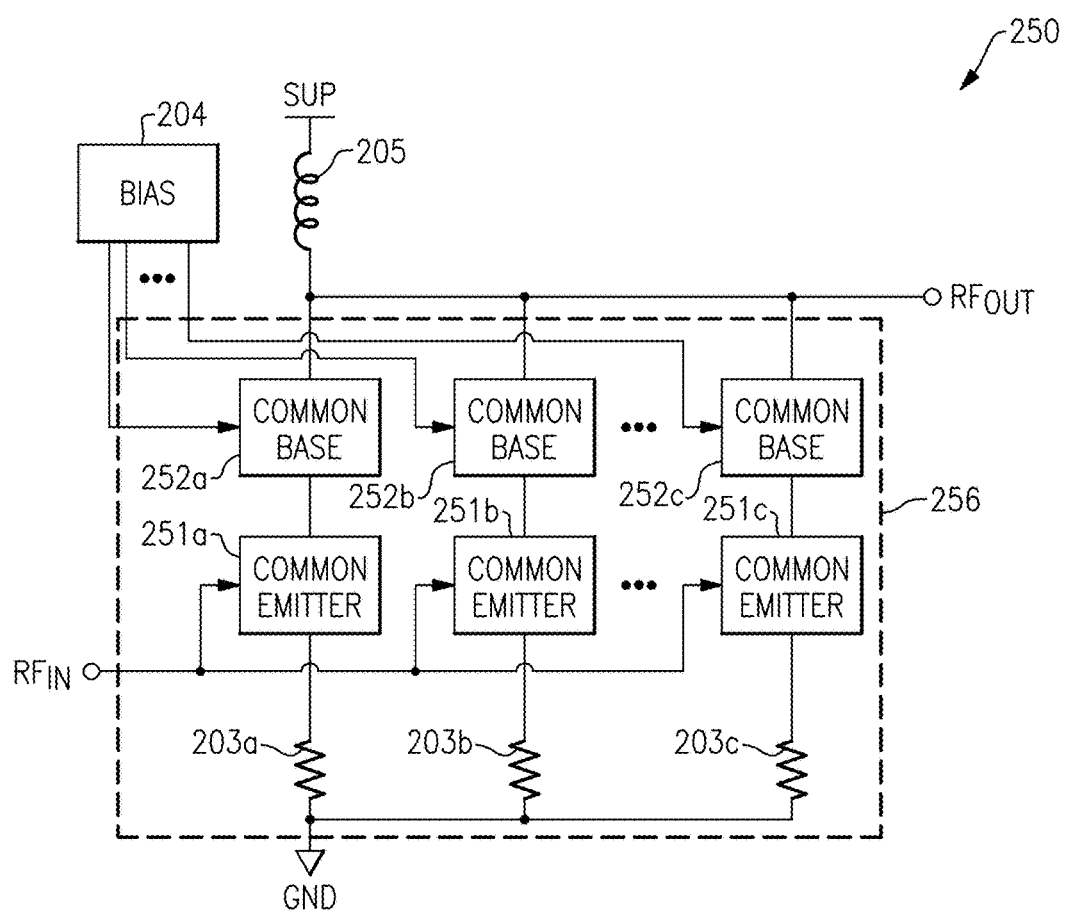
FIG. 7A is a schematic diagram of another embodiment of a power amplifier with separated cascode biasing.

FIG. 7A is a schematic diagram of another embodiment of a power amplifier system 250 with separated cascode biasing. The power amplifier system 250 includes an input terminal $RF_{IN}$, an output terminal $RF_{OUT}$, a bias circuit 204, a choke inductor 205, and a cascode power amplifier 256 that includes common emitter bipolar transistors 251a-251c, common base bipolar transistors 252a-252c, and degeneration resistors 203a-203c.

The power amplifier system 250 of FIG. 7A is similar to the power amplifier system 210 of FIG. 5, except that the power amplifier system 250 illustrates a specific implementation of transconductance and cascode devices, and illustrates an implementation including degeneration circuitry.

For example, the power amplifier system 250 of FIG. 7A includes transconductance devices implemented as common emitter bipolar transistors 251a-251c and cascode devices implemented as common base bipolar transistors 252a-252c. Additionally, the power amplifier system 250 includes degeneration circuits, implemented as degeneration resistors 203a-203c, in this embodiment. In another embodiment, the degeneration circuitry includes degeneration inductors or a combination of degeneration resistors and degeneration inductors.

Although one example of a cascode power amplifier with separate cascode biasing is shown, the teachings herein are applicable to cascode power amplifiers implemented in a wide variety of ways.

Figure 7B:
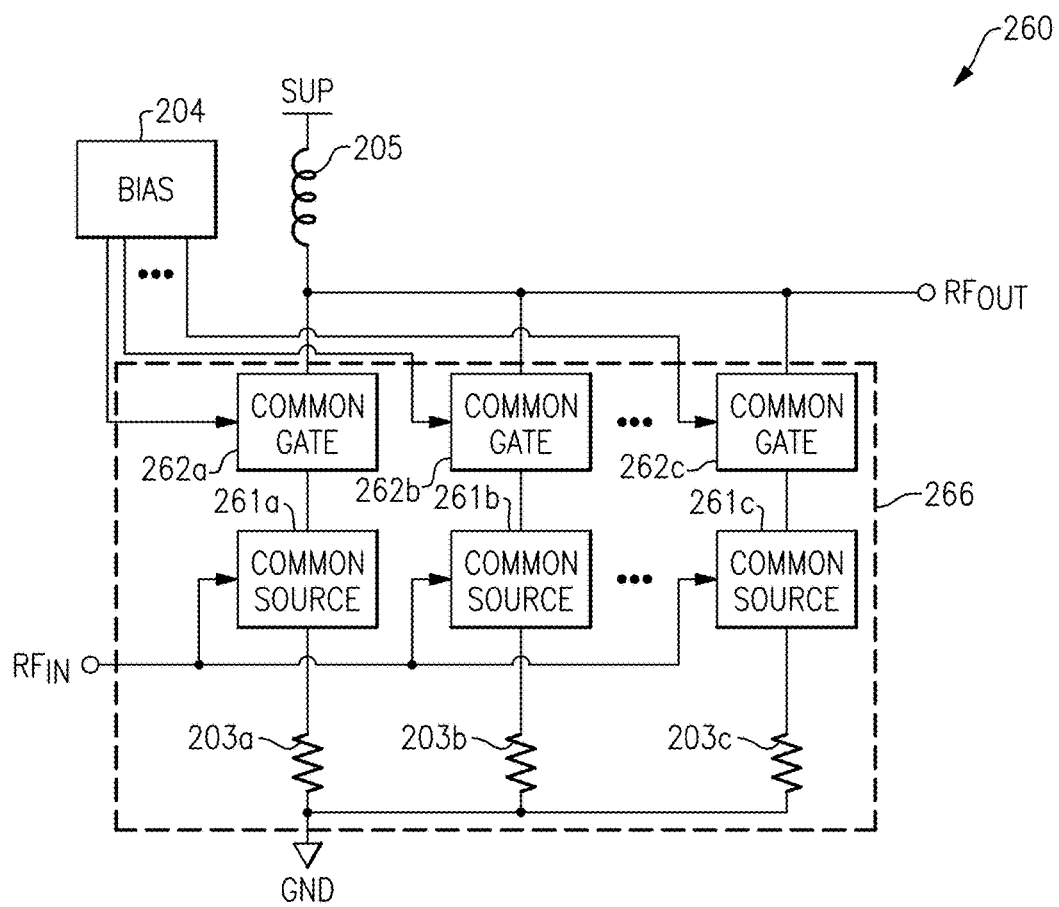
FIG. 7B is a schematic diagram of another embodiment of a power amplifier with separated cascode biasing.

FIG. 7B is a schematic diagram of another embodiment of a power amplifier system 260 with separated cascode biasing. The power amplifier system 260 includes an input terminal $RF_{IN}$, an output terminal $RF_{OUT}$, a bias circuit 204, a choke inductor 205, and a cascode power amplifier 266 that includes common source field-effect transistors 261a-261c (FETs), common gate FETs 262a-262c, and degeneration resistors 203a-203c.

The power amplifier system 260 of FIG. 7B is similar to the power amplifier system 250 of FIG. 7A, except that the power amplifier system 260 is implemented using FETs rather than bipolar transistors. For example, the power amplifier system 260 of FIG. 7B includes transconductance devices implemented as common source FETs 261a-261c and cascode devices implemented as common gate FETs 262a-262c.

Figure 7C:
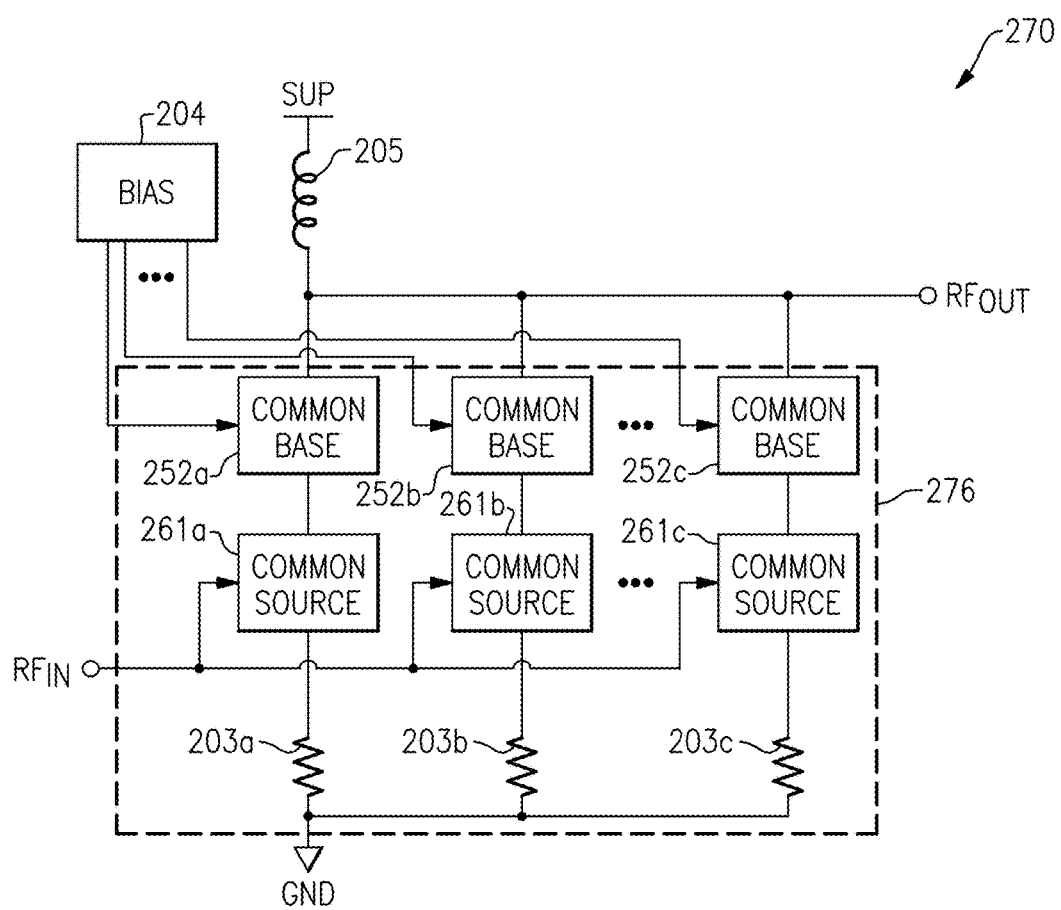
FIG. 7C is a schematic diagram of another embodiment of a power amplifier with separated cascode biasing.

FIG. 7C is a schematic diagram of another embodiment of a power amplifier system 270 with separated cascode biasing. The power amplifier system 270 includes an input terminal $RF_{IN}$, an output terminal $RF_{OUT}$, a bias circuit 204, a choke inductor 205, and a cascode power amplifier 276 that includes common source FETs 261a-261c, common base bipolar transistors 252a-252c, and degeneration resistors 203a-203c.

The power amplifier system 270 illustrates one example of a cascode power amplifier that includes a combination of bipolar transistors and field-effect transistors. However, other implementations of cascode power amplifiers using a combination of transistor types are possible.

Figure 7D:
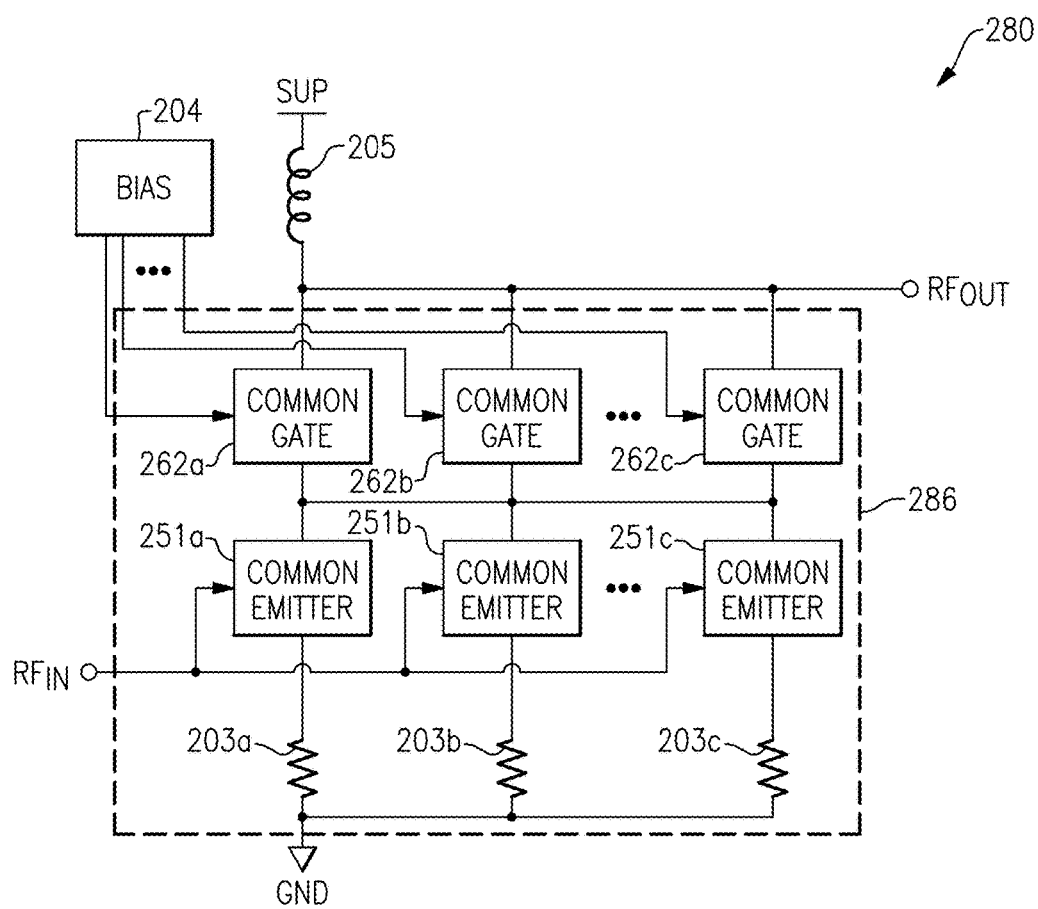
FIG. 7D is a schematic diagram of another embodiment of a power amplifier with separated cascode biasing.

FIG. 7D is a schematic diagram of another embodiment of a power amplifier system 280 with separated cascode biasing. The power amplifier system 280 includes an input terminal $RF_{IN}$, an output terminal $RF_{OUT}$, a bias circuit 204, a choke inductor 205, and a cascode power amplifier 286 that includes common emitter bipolar transistors 251a-251c, common gate FETs 262a-262c, and degeneration resistors 203a-203c.

The power amplifier system 280 illustrates another example of a cascode power amplifier that includes a combination of bipolar and FETs. The power amplifier system 280 also illustrates an embodiment in which an intermediate connection between each pair of transconductance and cascode devices is connected at a shared or common node. Any of the cascode power amplifiers described herein can be modified to include such an intermediate connection between transconductance devices and cascode devices.

The cascode power amplifier 280 of FIG. 7D illustrates another example of a cascode power amplifier with separate cascode biasing. However, the teachings herein are applicable to cascode power amplifiers implemented in a wide variety of ways.

Figure 8A:
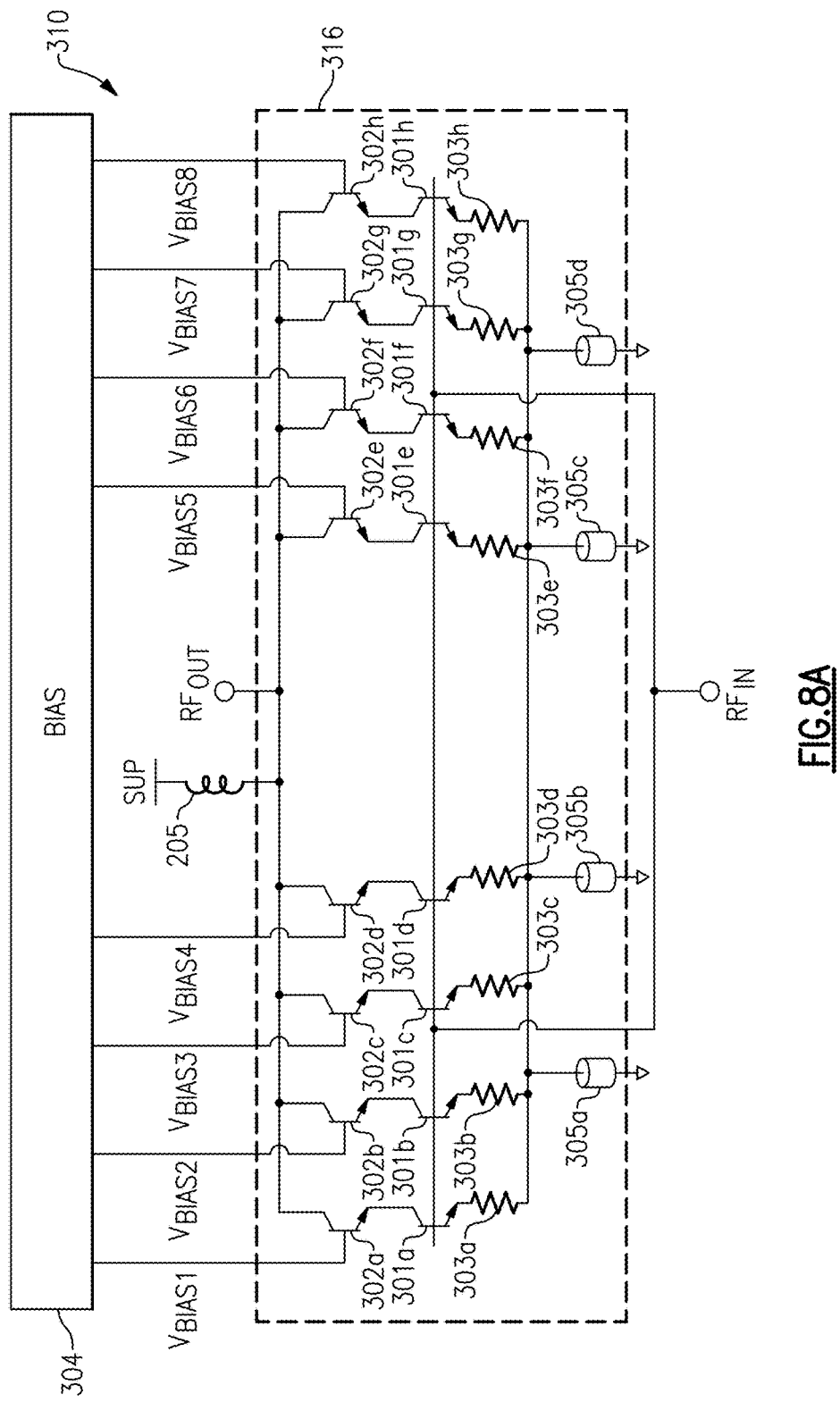
FIG. 8A is a schematic diagram of another embodiment of a power amplifier with separated cascode biasing.

FIG. 8A is a schematic diagram of another embodiment of a power amplifier system 310 with separated cascode biasing. The power amplifier system 310 includes an input terminal $RF_{IN}$, an output terminal $RF_{OUT}$, a bias circuit 304, a choke inductor 205, and a cascode power amplifier 316 that includes common emitter bipolar transistors 301a-301h, common base bipolar transistors 302a-302h, degeneration resistors 303a-303h, and through-wafer vias (TWVs) 305a-305d.

As persons of ordinary skill in the art will appreciate, a semiconductor die includes a first or active side including semiconductor devices fabricated thereon, and a second or back side opposite to the active side. Additionally, a TWV provides an electrical connection through the die from the active side to the back side. For example, one or more TWVs can be included on the die to provide an electrical connection between circuitry fabricated on the active side and a backside conductor carrying a ground voltage.

In the illustrated embodiment, eight transistor cells have been electrically connected in parallel. By parallelizing transistor cells, the cascode power amplifier's power handling capability can be increased to achieve a desired output power handling capability. Although an implementation with eight transistor cells is shown in FIG. 8A, a cascode power amplifier can include more or fewer transistor cells connected in parallel.

As shown in FIG. 8A, the illustrated common base bipolar transistors 302a-302h each include a base that is provided with a separate bias voltage. In particular, common base bipolar transistors 302a-302h receive bias voltages $V_{BIAS1}$, $V_{BIAS2}$, $V_{BIAS3}$, $V_{BIAS4}$, $V_{BIAS5}$, $V_{BIAS6}$, $V_{BIAS7}$, and $V_{BIAS8}$, respectively. By implementing the cascode power amplifier in this manner, inductance is eliminated between the bases of the common base bipolar transistors 302a-302h.

In contrast, a cascode power amplifier with a shared bias circuit can have inductance present between the cascode devices, which can lead to the cascode power amplifier operating as an oscillator at high frequencies.

Although certain layout techniques, such as a short common bias conductor can reduce an amount of parasitic inductance between cascode devices, layout techniques alone may be insufficient to suppress oscillations. For instance, a cascode power amplifier that provides amplification to relatively high frequencies, such as millimeter wave frequencies, may be susceptible to oscillation when even a relatively small amount of inductance is present between the cascode power amplifier's cascode devices. Accordingly, such a cascode power amplifier may oscillate in high frequency applications even when using a common bias implemented using a relatively short biasing conductor.

Figure 8B:
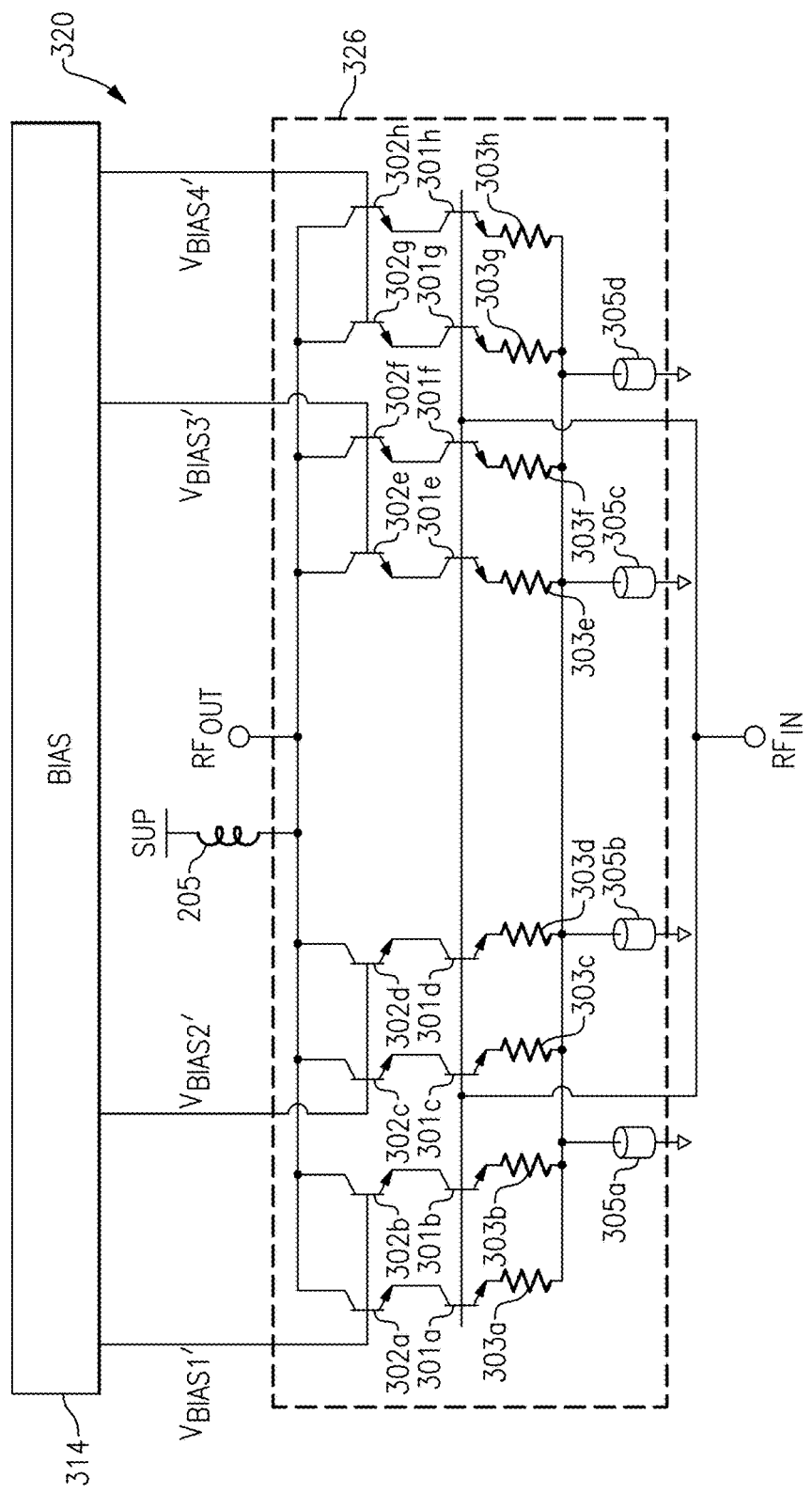
FIG. 8B is a schematic diagram of another embodiment of a power amplifier with separated cascode biasing.

FIG. 8B is a schematic diagram of another embodiment of a power amplifier system 320 with separated cascode biasing. The power amplifier system 320 includes an input terminal RF$_{IN}$, an output terminal RF$_{OUT}$, a bias circuit 314, a choke inductor 205, and a cascode power amplifier 326 that includes common emitter bipolar transistors 301a-301h, common base bipolar transistors 302a-302h, degeneration resistors 303a-303h, and TWVs 305a-305d.

The power amplifier system 320 of FIG. 8B is similar to the power amplifier system 310 of FIG. 8A, except that the power amplifier system 320 of FIG. 8B illustrates an implementation in which four bias voltages are used to bias eight common base cascode transistors.

For example, in the illustrated embodiment, common base bipolar transistors 302a-302b receive V$_{BIAS1}$', common base bipolar transistors 302c-302d receive V$_{BIAS2}$', common base bipolar transistors 302e-302f receive V$_{BIAS3}$', and common base bipolar transistors 302g-302h receive V$_{BIAS4}$'.

In certain embodiments, multiple bias signals (for instance, bias voltages) are used to bias multiple cascode devices. However, certain cascode devices, such as cascode devices that are in close physical proximity to one another on chip, can operate using a shared bias.

Figure 8C:
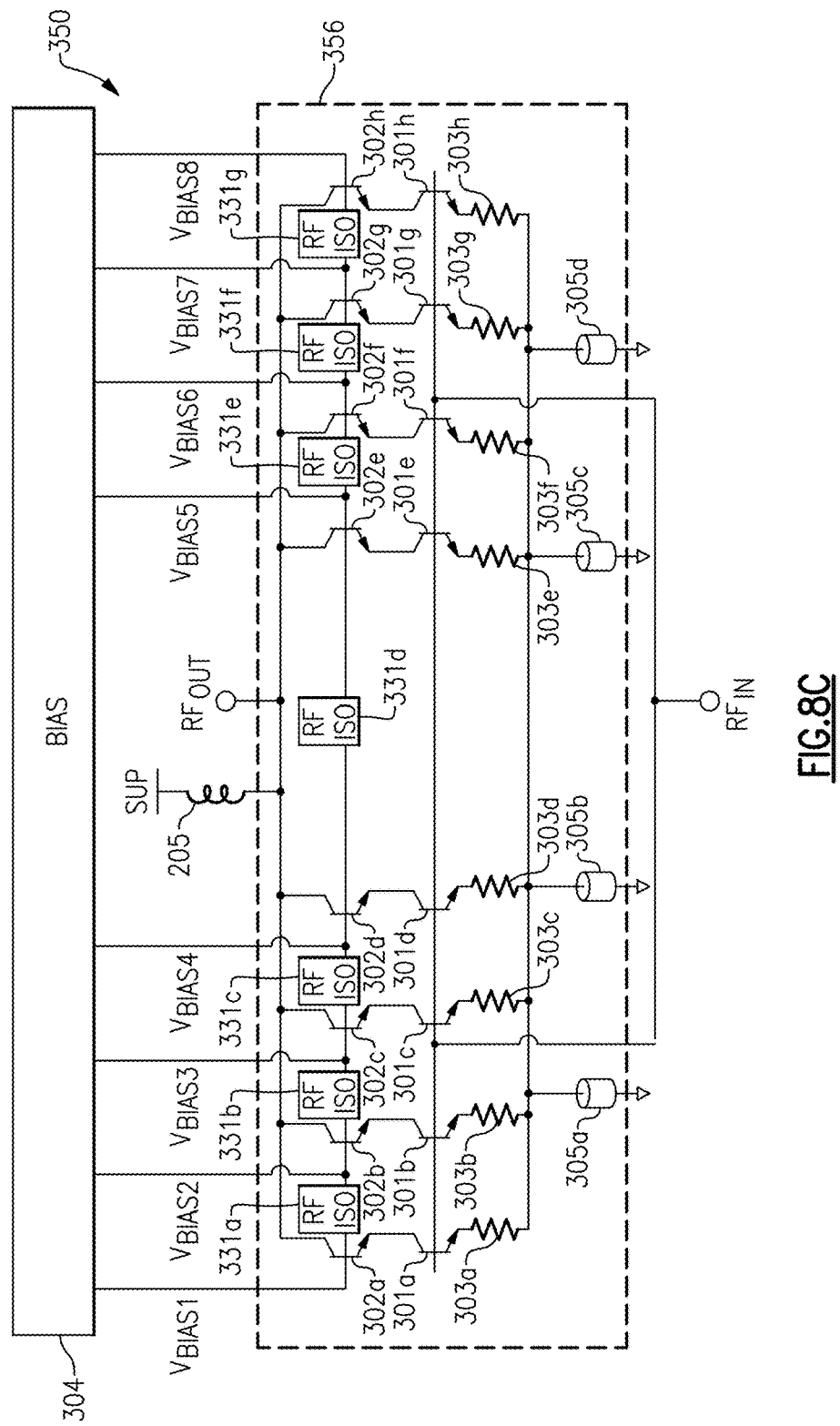
FIG. 8C is a schematic diagram of another embodiment of a power amplifier with separated cascode biasing.

FIG. 8C is a schematic diagram of another embodiment of a power amplifier system 350 with separated cascode biasing. The power amplifier system 350 includes an input terminal RF$_{IN}$, an output terminal RF$_{OUT}$, a bias circuit 304, a choke inductor 205, and a cascode power amplifier 356 that includes common emitter bipolar transistors 301a-301h, common base bipolar transistors 302a-302h, degeneration resistors 303a-303h, TWVs 305a-305d, and RF isolation circuits 331a-331g.

The power amplifier system 350 of FIG. 8C is similar to the power amplifier system 310 of FIG. 8A, except that the power amplifier system 350 of FIG. 8C includes the RF isolation circuits 331a-331g.

The RF isolation circuits 331a-331g are used to provide RF isolation between cascode devices (thus substantially blocking RF signals), while providing DC coupling to aid in reducing or eliminating variation in the DC bias voltage levels of the bias voltages generated by the bias circuit 304.

Although FIG. 8C illustrates an example in which RF isolation circuits (for instance, inductors and/or resistors) are used to provide RF isolation, in other embodiments electrically disconnected conductors are used to bias different cascode devices. Such electrically disconnected conductors can include a first biasing conductor separated from a second biasing conductor by dielectric, thereby isolating the first biasing conductor and the second biasing conductor from one another. Such biasing conductors can further include shielding to inhibit electromagnetic fields from impacting the voltages of the biasing conductors.

Figure 9:
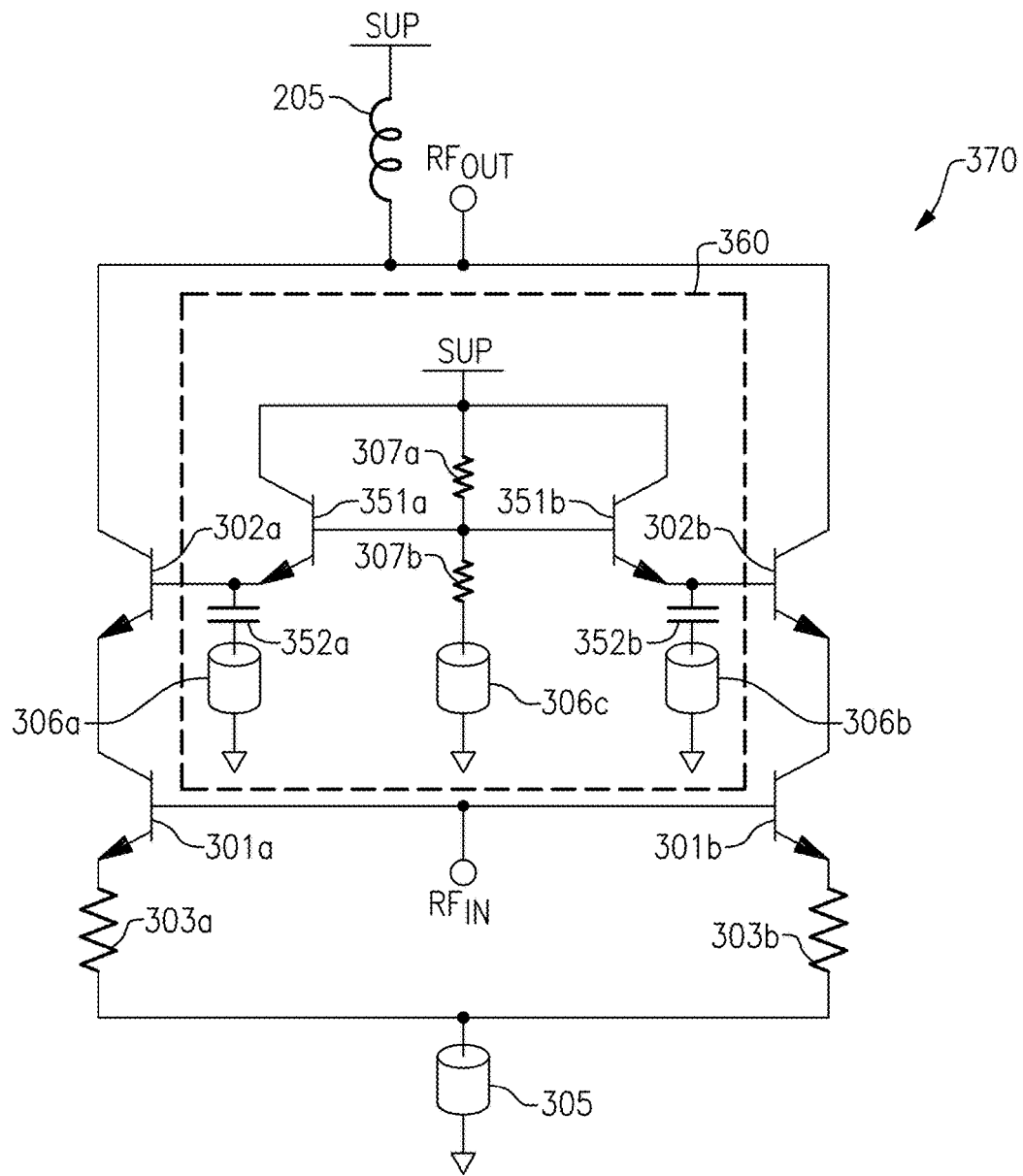
FIG. 9 is a schematic diagram of another embodiment of a power amplifier system with separated cascode biasing.

FIG. 9 is a schematic diagram of another embodiment of a power amplifier system 370 with separated cascode biasing. The power amplifier system 370 includes an input terminal RF$_{IN}$, an output terminal RF$_{OUT}$, a bias circuit 360, a choke inductor 205, and a cascode power amplifier that includes common emitter bipolar transistors 301a-301b, common base bipolar transistors 302a-302b, degeneration resistors 303a-303b, and a TWV 305.

The power amplifier system 370 of FIG. 9 illustrates one embodiment of a bias circuit 360 for a cascode power amplifier. The illustrated bias circuit 360 includes emitter follower bipolar transistors 351a-351b, AC grounding capacitors 352a-352b, biasing resistors 307a-307b, and TWVs 306a-306c. Although one embodiment of a bias circuit for a cascode power amplifier is shown, the teachings herein are applicable to bias circuits implemented in a wide variety of ways.

The illustrated bias circuit 360 includes a first follower transistor (implemented as emitter follower bipolar transistor 351a, in this embodiment) that generates a first bias voltage and a second follower transistor (implemented as a second emitter follower bipolar transistor 351b, in this embodiment) that generates a second bias voltage. Follower transistors (for instance, emitter follower bipolar transistors and/or source follower FETs) are used to generate separate bias voltages, in certain embodiments.

Additionally, an AC grounding capacitor is included between the base of each cascode device and ground. For example, the AC grounding capacitor 352a is electrically connected between the base of the common base bipolar transistor 302a and ground, and the AC grounding capacitor 352b is electrically connected between the base of the common base bipolar transistor 302b and ground. In the illustrated embodiment, the AC grounding capacitors are electrically connected to ground by way of TWVs 306a-306b, respectively.

The follower transistors 351a-351b receive a common reference voltage, in this embodiment. In the illustrated embodiment, the common reference voltage is generated by a voltage divider, which is implemented using resistors 307a-307b electrically connected in series with the TWV 306c, in this embodiment. The voltage divider is connected between the supply voltage SUP and ground, in this embodiment.

Figure 10A:
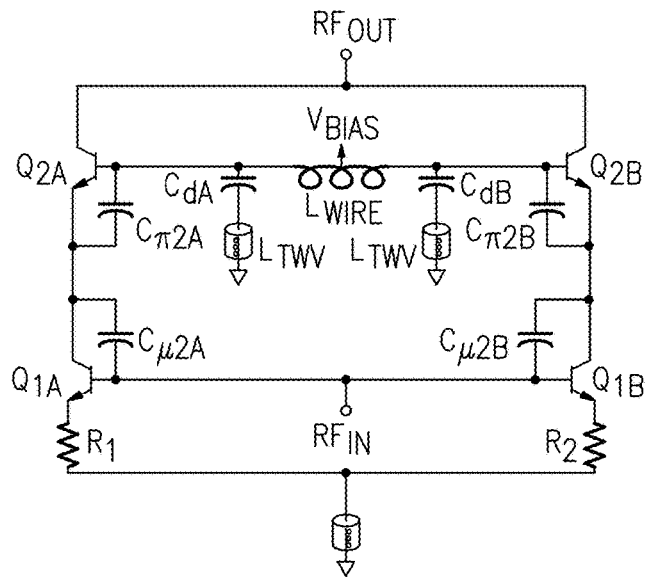
FIG. 10A is a schematic diagram of one example of a power amplifier system with shared cascode biasing.

FIG. 10A is a schematic diagram of one example of a power amplifier system with shared cascode biasing. The power amplifier system includes two transistor cells electrically connected in parallel and biased using a common bias voltage.

With continuing reference to FIG. 10A, $Q_{1A}$ is a common emitter transistor of a left power cell, $Q_{2A}$ is a common base transistor of the left power cell, and R1 is a degeneration resistor of the left power cell. Additionally, $Q_{1B}$ is a common emitter transistor of a right power cell, $Q_{2B}$ is a common base transistor of the right power cell, and R2 is a degeneration resistor of the right power cell. Furthermore, $L_{WIRE}$ represents a parasitic inductance of the shared base biasing wire. Additionally, $C_{dA}$ and $C_{dB}$ are explicit AC grounding capacitors to AC ground the base nodes of the common base transistors. Furthermore, $L_{TWV}$ represents the inductance of the through wafer vias (TWVs) used to ground the bottom plate of the AC grounding capacitors. Additionally, $C_{\pi 2A}$, $C_{\pi 2B}$, $C_{\mu 2A}$, and $C_{\mu 2B}$ represent junction capacitances present in the transistors.

Ideally, $C_{dA}$ and $C_{dB}$ provide a short circuit to ground the bases of both Q2A and Q2B. However, due to the inductance of the TWVs, at some frequency these capacitors resonate with the TWV inductance and above this frequency this path behaves inductively and forms a second inductor in parallel with $L_{WIRE}$.

Figure 10B:
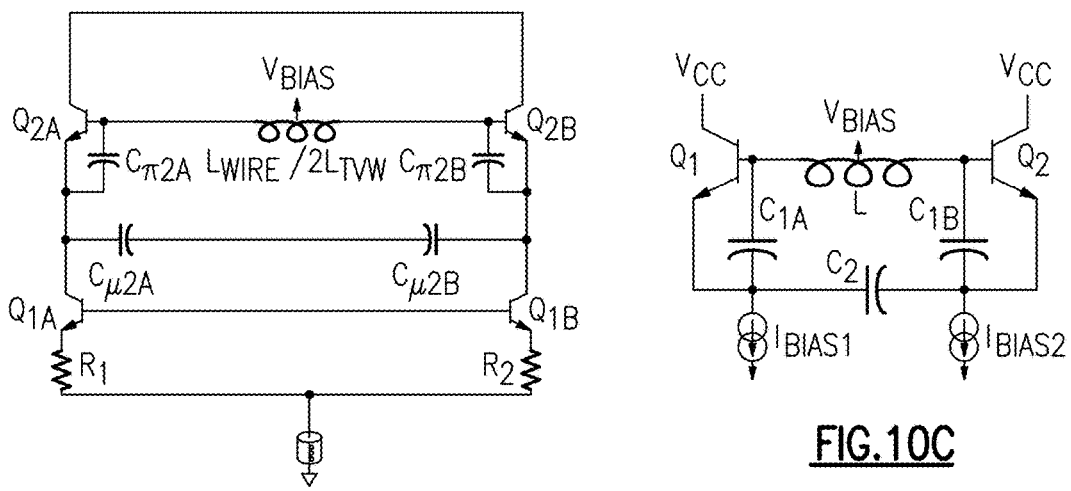
FIG. 10B is a schematic diagram representing high frequency operation of the power amplifier system of FIG. 10A.

FIG. 10B is a schematic diagram representing high frequency operation of the power amplifier system of FIG. 10A.

Figure 10C:
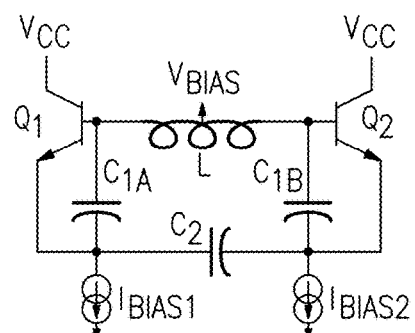
FIG. 10C is a schematic diagram of one example of a differential Colpitts oscillator.

FIG. 10C is a schematic diagram of one example of a differential Colpitts oscillator. The differential Colpitts oscillator includes a first bipolar transistor Q1, a second bipolar transistor Q2, a first base-to-emitter capacitor $C_{1A}$, a second base-to-emitter capacitor $C_{1B}$, a capacitor C2, an inductor L, a first bias current source $I_{BIAS1}$, and a second bias current source $I_{BIAS2}$.

As shown by a comparison of FIGS. 10B and 10C, at high frequencies the power amplifier system of FIG. 10A can behave as a differential Colpitts oscillator.

Examples of Electronic Systems Including Cascode Power Amplifiers

A cascode power amplifier can be integrated on a semiconductor die, which in turn can be included in a wide variety of electronic systems.

Figure 11A:
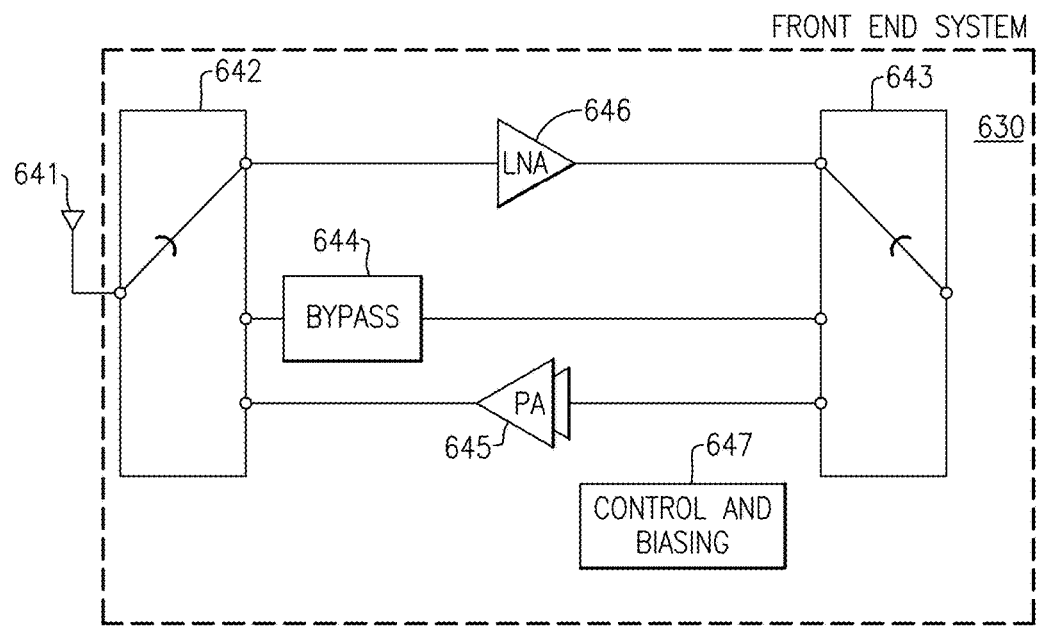
FIG. 11A is a schematic diagram of a front end system according to one embodiment.
Figure 11B:
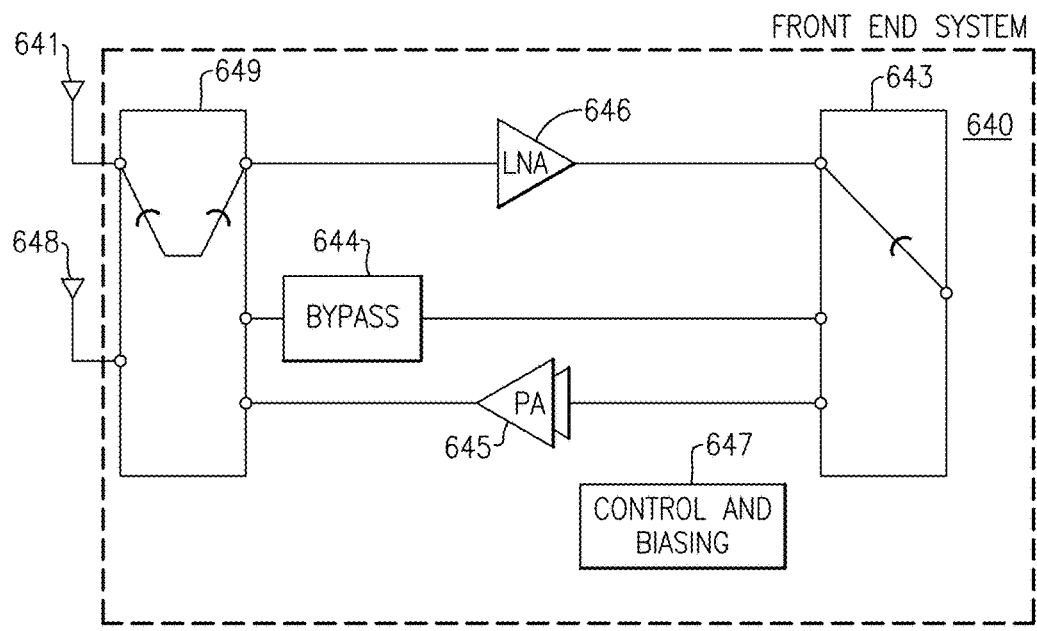
FIG. 11B is a schematic diagram of a front end system according to another embodiment.

FIG. 11A is a schematic diagram of a front end system 630 according to one embodiment. FIG. 11B is a schematic diagram of a front end system 640 according to another embodiment.

An RF front end system can include circuits in a signal path between an antenna and a baseband system. Some RF front ends can include circuits in signal paths between one or more antennas and a mixer configured to modulate a signal to RF or to demodulate an RF signal.

The front end systems of FIGS. 11A and 11B can be implemented in a packaged module. Such packaged modules can include relatively low cost laminate based front end modules that combine power amplifiers with low noise amplifiers and/or switch functions. Some such packaged modules can be multi-chip modules. In certain implementations, some or the all of the illustrated components in any of the front end systems in FIGS. 11A and/or 11B can be embodied on a single integrated circuit or die. Such a die can be manufactured using any suitable process technology. According to some implementations, one or more antennas can be integrated with any of the front end systems discussed herein.

With reference to FIG. 11A, the RF front end system 630 is configured to receive RF signals from an antenna 641 and to transmit RF signals by way of the antenna 641. The illustrated front end system 630 includes a first multi-throw switch 642, a second multi-throw switch 643, a receive signal path that includes an LNA 646, a bypass signal path that includes a bypass network 644, and a transmit signal path that includes a cascode power amplifier 645. The low noise amplifier 646 can be implemented by any suitable low noise amplifier. The bypass network 644 can include any suitable network for matching and/or bypassing the receive signal path and the transmit signal path. The bypass network 644 can be implemented by a passive impedance network or by a conductive trace or wire.

The cascode power amplifier 645 can be implemented in accordance with any of the principles and advantages discussed herein. In the illustrated embodiment, the cascode power amplifier 645 is a multi-stage power amplifier including at least an input stage and an output stage. In certain implementations, the output stage of the cascode power amplifier 645 includes multiple transistor cells including cascode devices that are separately biased by the control and biasing circuit 647.

The first multi-throw switch 642 can selectively connect a particular signal path to the antenna 641. The first multi-throw switch 642 can electrically connect the transmit signal path to the antenna 641 in a first state, electrically connect the receive signal path to the antenna 641 in a second state, and electrically connect the bypass signal path to the antenna 641 in a third state. The second multi-throw switch 643 can selectively connect a particular signal path to an input/output port of the front end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front end system 630.

The control and biasing circuit 647 can be used to control and bias circuitry of the RF front end system 630. In certain configurations, the control and biasing circuit 647 receives a mode control signal indicating a mode of operation of the cascode power amplifier 645. The mode control signal can be provided to the control and biasing circuit 647 in a variety of ways, such as over a serial interface. The control and biasing circuit 647 can use the mode control signal for a variety of purposes, including, for example, controlling a voltage level of a supply voltage used to power the cascode power amplifier 645 and/or controlling bias signal level of the cascode devices of the cascode power amplifier 645.

The RF front end system 640 of FIG. 11B is similar to the RF front end system 630 of FIG. 11A, except that the first multi-throw switch 649 is configured to selectively connect a particular signal path to either a first antenna 641 or a second antenna 648. The multi-throw switch 649 can be a multi-throw, multi-pole switch.

Figure 12A:
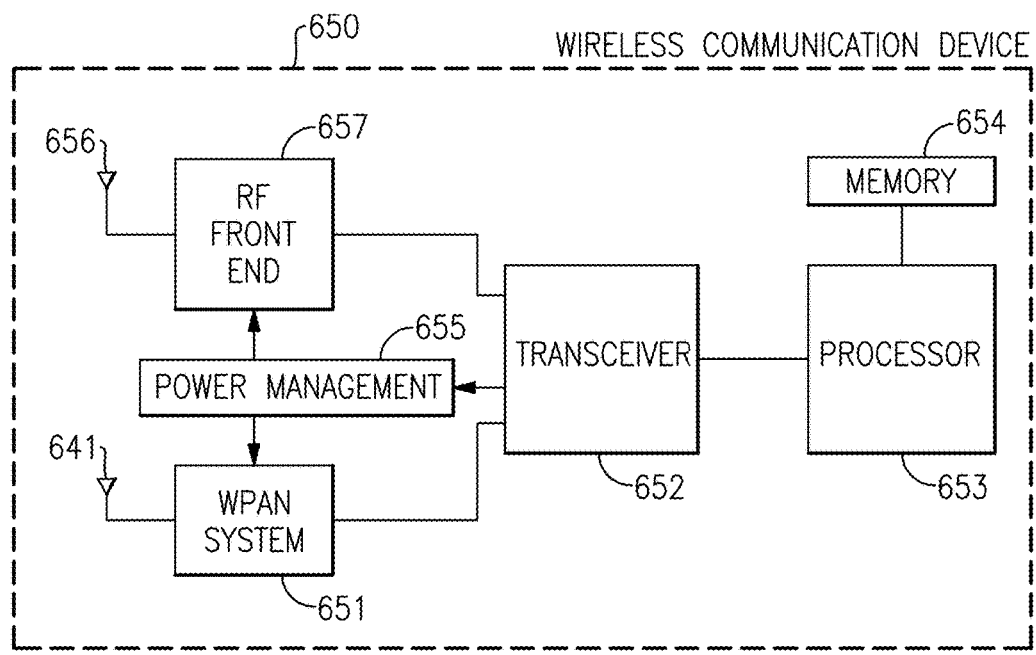
FIG. 12A is a schematic diagram of a wireless communication device according to one embodiment.
Figure 12B:
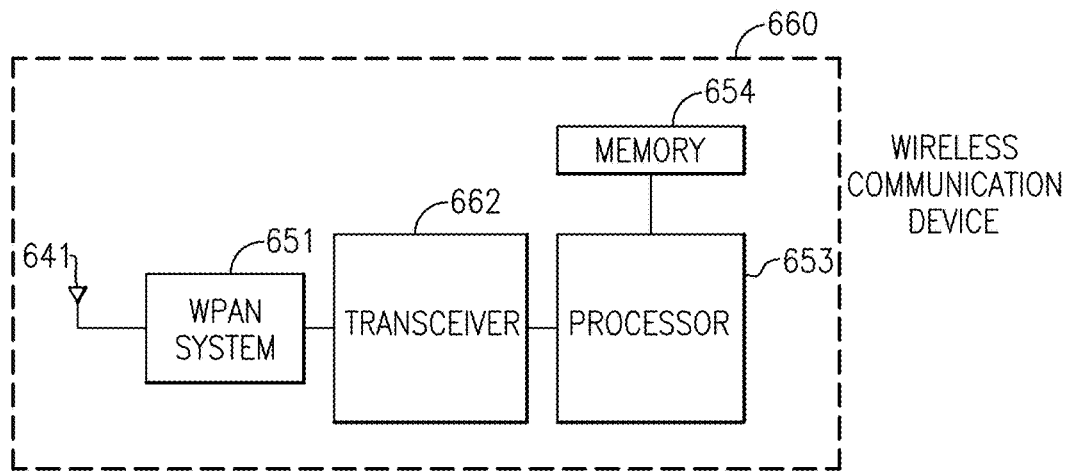
FIG. 12B is a schematic diagram of a wireless communication device according to another embodiment.

FIG. 12A is a schematic diagram of a wireless communication device 650 according to one embodiment. FIG. 12B is a schematic diagram of a wireless communication device 660 according to another embodiment.

FIGS. 12A and 12B are schematic block diagrams of illustrative wireless communication devices that include a cascode power amplifier in accordance with one or more embodiments.

As illustrated, the wireless communication device 650 includes a first antenna 641, a wireless personal area network (WPAN) system 651, a transceiver 652, a processor 653, a memory 654, a power management block 655, a second antenna 656, and an RF front end system 657. Any of the cascode power amplifiers discussed herein can be implemented in the WPAN system 651 and/or the RF front end system 657. The WPAN system 651 is an RF front end system configured for processing RF signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

The illustrated wireless communication device 660 of FIG. 12B is a device configured to communicate over a PAN. This wireless communication device can be relatively less complex than the wireless communication device 650 of FIG. 12A. As illustrated, the wireless communication device 660 includes an antenna 641, a WPAN system 651, a transceiver 662, a processor 653, and a memory 654. The WPAN system 660 can include one or more RF amplifiers in accordance with any of the principles and advantages discussed herein.

Figure 13:
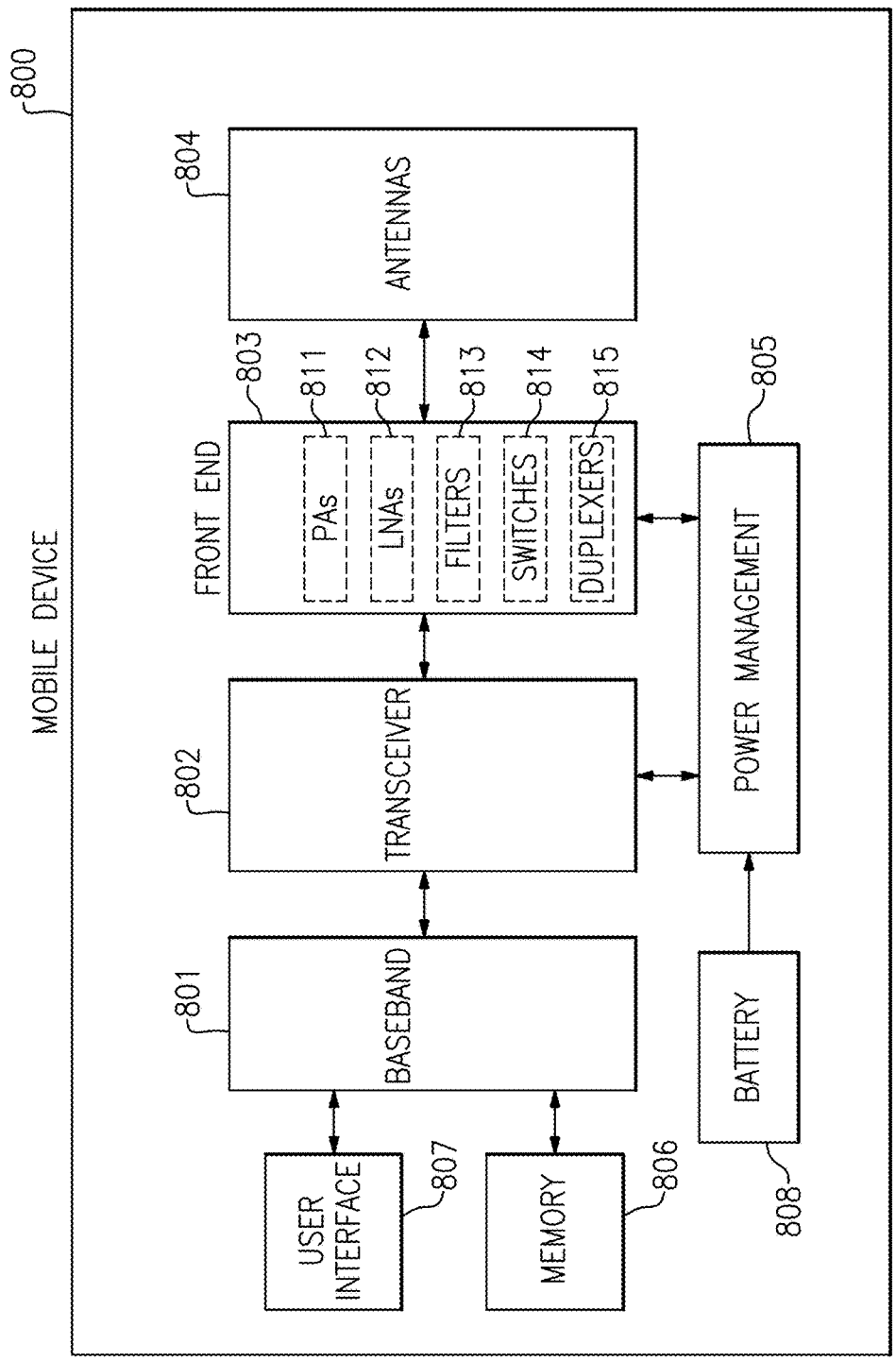
FIG. 13 is a schematic diagram of one embodiment of a mobile device.

FIG. 13 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 13 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the power amplifiers 811 is a cascode power amplifier implemented in accordance with one or more features disclosed herein.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 13, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 13, the power management system 805 receives a battery voltage from the battery 808. The battery 808 can be any suitable battery for use in the mobile device 800, including, for example, a lithium-ion battery.

Figure 14A:
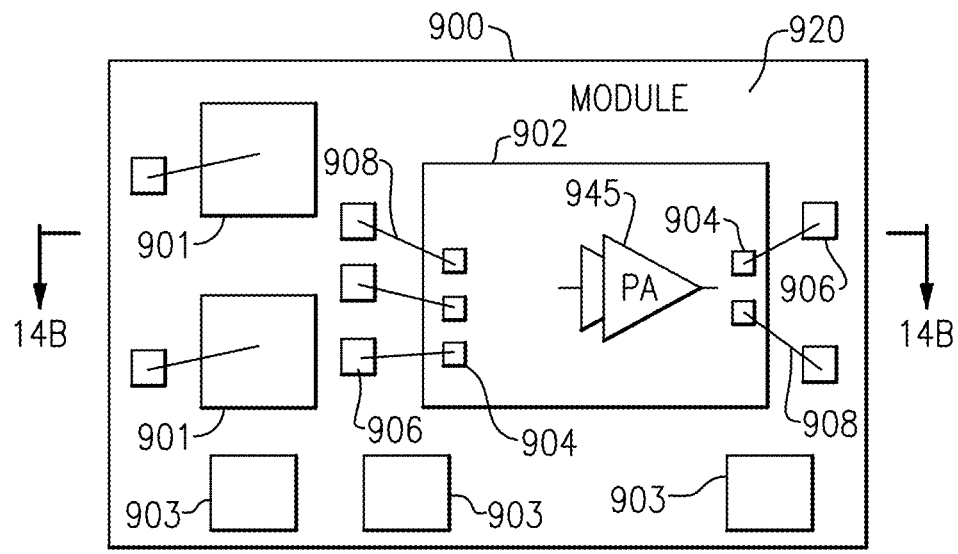
FIG. 14A is a schematic diagram of one embodiment of a packaged module.
Figure 14B:
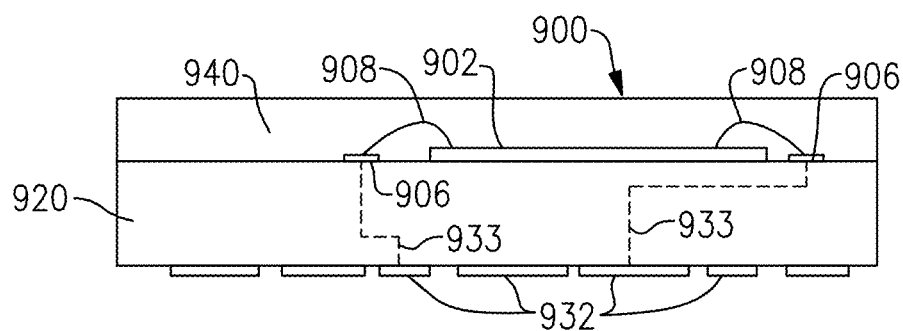
FIG. 14B is a schematic diagram of a cross-section of the packaged module of FIG. 14A taken along the lines 14B-14B.

FIG. 14A is a schematic diagram of one embodiment of a packaged module 900. FIG. 14B is a schematic diagram of a cross-section of the packaged module 900 of FIG. 14A taken along the lines 14B-14B.

The packaged module 900 includes radio frequency components 901, a semiconductor die 902, surface mount devices 903, wirebonds 908, a package substrate 920, and encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a cascode power amplifier 945, which can be implemented in accordance with one or more features disclosed herein.

As shown in FIG. 14B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a wireless device. The example contact pads 932 can be configured to provide radio frequency signals, bias signals, and/or power (for example, a power supply voltage and ground) to the semiconductor die 902. As shown in FIG. 14B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Although FIGS. 11A-14B illustrate examples of electronic systems that can include a cascode power amplifier implemented in accordance with the teachings herein, cascode power amplifiers can be used in other configurations of electronics.

Applications

Some of the embodiments described above have provided examples in connection with front end modules and/or wireless communication devices. However, the principles and advantages of the embodiments can be used for any other systems or apparatus that have needs for power amplifiers.

For example, power amplifiers can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
an input terminal configured to receive a radio frequency input signal;
an output terminal;
a cascode power amplifier including a plurality of transconductance devices each electrically coupled to the input terminal, and a plurality of cascode devices each electrically coupled to the output terminal, the plurality of transconductance devices configured to operate in combination with the plurality of cascode devices to amplify the radio frequency input signal;
a bias circuit configured to bias the plurality of cascode devices with two or more bias signals that are decoupled from one another at radio frequency so as to provide oscillation suppression to the cascode power amplifier, the two or more bias signals including a first bias voltage configured to bias a first portion of the plurality of cascode devices and a second bias voltage configured to bias a second portion of the plurality of cascode devices; and a radio frequency isolation circuit electrically coupled between the first bias voltage and the second bias voltage.

2. The power amplifier system of claim 1 wherein the plurality of transconductance devices include a plurality of common emitter bipolar transistors, and the plurality of cascode devices include a plurality of common base bipolar transistors.

3. The power amplifier system of claim 1 further comprising a plurality of degeneration circuits electrically coupled between the plurality of transconductance devices and ground.

4. The power amplifier system of claim 1 wherein the bias circuit is further configured to bias the plurality of transconductance devices with a common bias signal.

5. The power amplifier system of claim 1 wherein the bias circuit includes a first emitter follower bipolar transistor configured to generate the first bias voltage, and a second emitter follower bipolar transistor configured to generate the second bias voltage.

6. A power amplifier system comprising:
an input terminal configured to receive a radio frequency input signal;
an output terminal;
a cascode power amplifier including a plurality of transconductance devices each electrically coupled to the input terminal, and a plurality of cascode devices each electrically coupled to the output terminal, the plurality of transconductance devices configured to operate in combination with the plurality of cascode devices to amplify the radio frequency input signal; and
a bias circuit configured to bias the plurality of cascode devices with a plurality of bias voltages that are decoupled from one another at radio frequency so as to provide oscillation suppression to the cascode power amplifier, the bias circuit including a plurality of emitter follower bipolar transistors configured to bias the plurality of cascode devices with the plurality of bias voltages that are decoupled from one another at radio frequency.

7. The power amplifier system of claim 6 wherein the plurality of bias voltages each separately bias a corresponding one of the plurality of cascode devices.

8. The power amplifier system of claim 7 further comprising a plurality of biasing conductors configured to separately route a corresponding one of the plurality of bias voltages to a corresponding one of the plurality of cascode devices, each of the plurality of biasing conductors disconnected from one another.

9. The power amplifier system of claim 6 wherein the bias circuit is further configured to bias the plurality of transconductance devices with a common bias signal.

10. The power amplifier system of claim 6 further comprising a plurality of degeneration circuits electrically coupled between the plurality of transconductance devices and ground.

11. The power amplifier system of claim 6 wherein the plurality of transconductance devices include a plurality of common emitter bipolar transistors, and the plurality of cascode devices include a plurality of common base bipolar transistors.

12. A packaged module comprising:
a package substrate; and
a semiconductor die attached to the package substrate, the semiconductor die including an input terminal configured to receive a radio frequency input signal, an output terminal, and a cascode power amplifier including a bias circuit, a plurality of transconductance devices each electrically coupled to the input terminal, and a plurality of cascode devices each electrically coupled to the output terminal, the plurality of transconductance devices configured to operate in combination with the plurality of cascode devices to amplify the radio frequency input signal, and the bias circuit configured to bias the plurality of cascode devices with two or more bias signals that are decoupled from one another at radio frequency so as to provide oscillation suppression to the cascode power amplifier, the two or more bias signals including a first bias voltage configured to bias a first portion of the plurality of cascode devices and a second bias voltage configured to bias a second portion of the plurality of cascode devices, the cascode power amplifier further including a radio frequency isolation circuit electrically coupled between the first bias voltage and the second bias voltage.

13. The packaged module of claim 12 wherein the plurality of transconductance devices include a plurality of common emitter bipolar transistors, and the plurality of cascode devices include a plurality of common base bipolar transistors.

14. The packaged module of claim 12 wherein the bias circuit is further configured to bias the plurality of transconductance devices with a common bias signal.

15. The packaged module of claim 12 wherein the cascode power amplifier further includes a plurality of degeneration circuits electrically coupled between the plurality of transconductance devices and ground.

16. The packaged module of claim 12 wherein the bias circuit includes a first emitter follower bipolar transistor configured to generate the first bias voltage, and a second emitter follower bipolar transistor configured to generate the second bias voltage.

17. A packaged module comprising:
a package substrate; and
a semiconductor die attached to the package substrate, the semiconductor die including an input terminal configured to receive a radio frequency input signal, an output terminal, and a cascode power amplifier including a bias circuit, a plurality of transconductance devices each electrically coupled to the input terminal, and a plurality of cascode devices each electrically coupled to the output terminal, the plurality of transconductance devices configured to operate in combination with the plurality of cascode devices to amplify the radio frequency input signal, and the bias circuit configured to bias the plurality of cascode devices with a plurality of bias voltages that are decoupled from one another at radio frequency so as to provide oscillation suppression to the cascode power amplifier, the bias circuit including a plurality of emitter follower bipolar transistors configured to bias the plurality of cascode devices with the plurality of bias voltages that are decoupled from one another at radio frequency.

18. The packaged module of claim 17 wherein the plurality of bias voltages each separately bias a corresponding one of the plurality of cascode devices.

19. The packaged module of claim 18 wherein the semiconductor die further includes a plurality of biasing conductors configured to separately route a corresponding one of the plurality of bias voltages to a corresponding one of the plurality of cascode devices, each of the plurality of biasing conductors disconnected from one another.

20. The packaged module of claim 17 wherein the bias circuit is further configured to bias the plurality of transconductance devices with a common bias signal.

\* \* \* \* \*